(12) United States Patent
Meade

(10) Patent No.: US 12,512,402 B2
(45) Date of Patent: Dec. 30, 2025

(54) CHIP-LAST WAFER-LEVEL FAN-OUT WITH OPTICAL FIBER ALIGNMENT STRUCTURE

(71) Applicant: Ayar Labs, Inc., Santa Clara, CA (US)

(72) Inventor: Roy Edward Meade, Lafayette, CA (US)

(73) Assignee: Ayar Labs, Inc., San Jose, CA (US)

( * ) Notice: Subject to any disclaimer, the term of this patent is extended or adjusted under 35 U.S.C. 154(b) by 0 days.

(21) Appl. No.: 18/515,078

(22) Filed: Nov. 20, 2023

(65) Prior Publication Data

US 2024/0170387 A1    May 23, 2024

Related U.S. Application Data

(62) Division of application No. 17/175,490, filed on Feb. 12, 2021, now Pat. No. 11,823,990.

(60) Provisional application No. 62/976,305, filed on Feb. 13, 2020.

(51) Int. Cl.
| | |
|---|---|
| *H01L 23/498* | (2006.01) |
| *G02B 6/42* | (2006.01) |
| *H01L 21/48* | (2006.01) |
| *H01L 21/56* | (2006.01) |
| *H01L 23/31* | (2006.01) |

(52) U.S. Cl.
CPC ...... *H01L 23/49838* (2013.01); *G02B 6/4243* (2013.01); *H01L 21/4857* (2013.01); *H01L 21/561* (2013.01); *H01L 21/563* (2013.01); *H01L 21/568* (2013.01); *H01L 23/3185* (2013.01); *H01L 23/49822* (2013.01)

(58) Field of Classification Search
None
See application file for complete search history.

(56) References Cited

U.S. PATENT DOCUMENTS

2020/0003975 A1*  1/2020  Yu ................... G02B 6/4243
2020/0310052 A1*  10/2020  Lim ................... H01L 21/56

* cited by examiner

*Primary Examiner* — Jay C Chang
(74) *Attorney, Agent, or Firm* — Penilla IP, APC

(57) ABSTRACT

A redistribution layer is formed on a carrier wafer. A cavity is formed within the redistribution layer. An electro-optical die is flip-chip connected to the redistribution layer. A plurality of optical fiber alignment structures within the electro-optical die is positioned over and exposed to the cavity. Mold compound material is disposed over the redistribution layer and the electro-optical die. A residual kerf region of the electro-optical die interfaces with the redistribution layer to prevent mold compound material from entering into the optical fiber alignment structures and the cavity. The carrier wafer is removed from the redistribution layer. The redistribution layer and the mold compound material are cut to obtain an electro-optical chip package that includes the electro-optical die. The cutting removes the residual kerf region from the electro-optical die to expose the plurality of optical fiber alignment structures and the cavity at an edge of the electro-optical chip package.

30 Claims, 30 Drawing Sheets

(View A-A)

(View A-A)

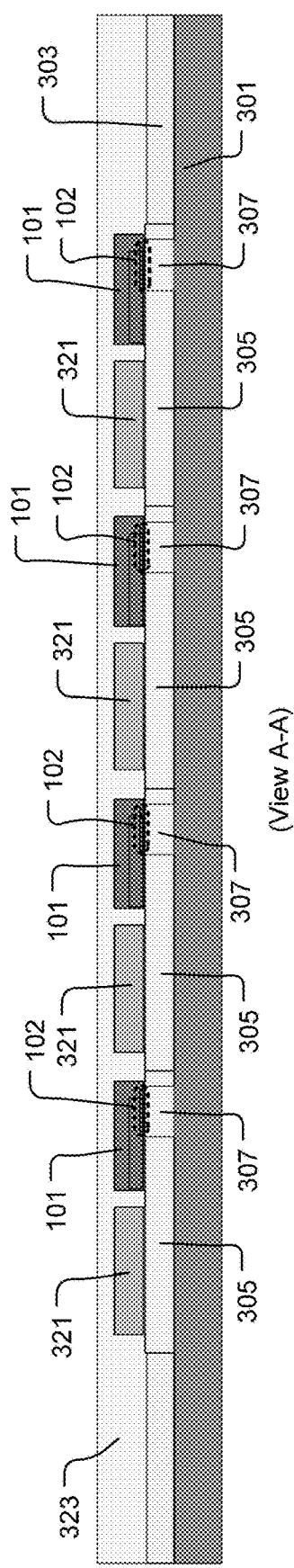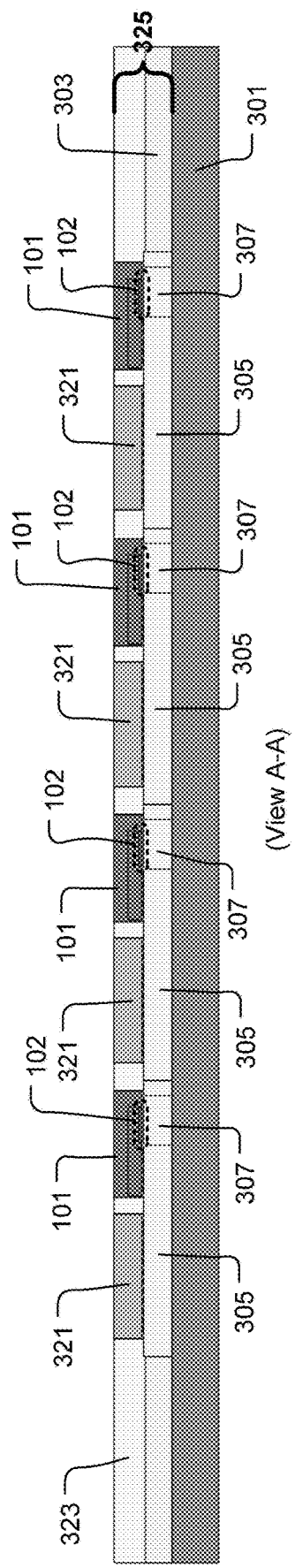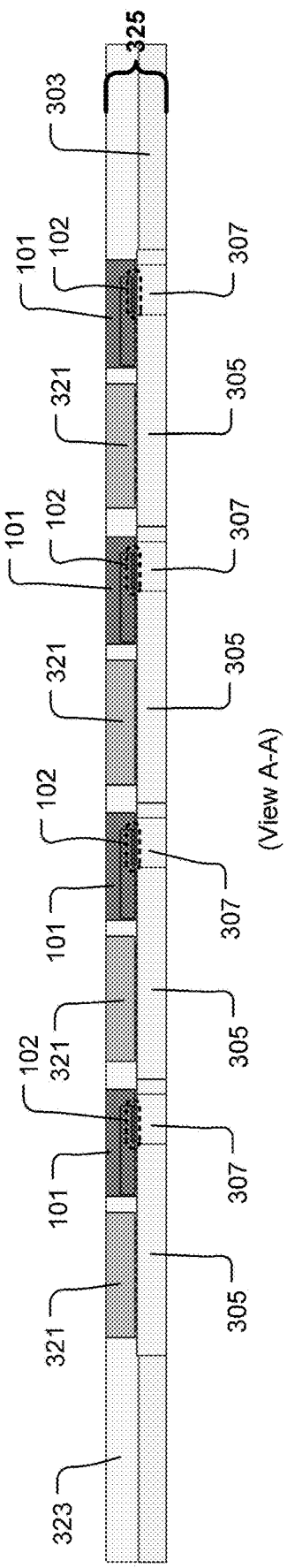
(View A-A)
Fig. 3L
(View A-A)
Fig. 3O
(View A-A)
Fig. 3R (View B-B)

(View B-B)

(View B-B)

CHIP-LAST WAFER-LEVEL FAN-OUT WITH OPTICAL FIBER ALIGNMENT STRUCTURE

CLAIM OF PRIORITY

This application is a divisional application under 35 U.S.C. 121 of prior-filed U.S. patent application Ser. No. 17/175,490, filed on Feb. 12, 2021, which claims priority under 35 U.S.C. 119(e) to U.S. Provisional Patent Application No. 62/976,305, filed on Feb. 13, 2020. The disclosure of each above-identified patent application is incorporated herein by reference in its entirety for all purposes.

BACKGROUND

In semiconductor device fabrication, integrated circuit packaging is a later stage of fabrication in which one or more integrated circuit die are attached to a supporting package that supports electrical contacts to enable connection of the one or more integrated circuit die to one or more external devices. The electronics industry has developed a multitude of package styles, including wire bonding, flip-chip onto both organic and ceramic substrates, flip-chip onto silicon and glass interposers, package-on-package, and wafer/panel-level fan-out and fan-in, among others. Diversity in package styles in the electronics industry is intended to support different cost and performance requirements. For example, lower power applications (e.g., mobile device applications) often use wafer-level fan-out technology. 2.5D silicon interposers are used for High Performance Computing (HPC) applications. The term "2.5D" refers to a packaging technology in which multiple die are included inside the same package. The term "2.1D" refers to a packaging technology in which a high-density wiring layer formed on the chip side of the substrate acts as an interposer, instead of the using a silicon interposer, such as in the 2.5D approach. The 2.1D packaging technology is potentially lower cost than the 2.5D packaging technology. However, there are technical challenges with both the 2.1D and 2.5D packaging technologies, particularly in silicon photonic packaging implementations for use in optical data communication systems. It is within this context that the present invention arises.

SUMMARY

In an example embodiment, a method is disclosed for packaging an electro-optical die. The method includes having a redistribution layer formed on a carrier wafer. The method also includes forming a cavity within an area of the redistribution layer. The method also includes flip-chip connecting an electro-optical die to the redistribution layer, such that a plurality of optical fiber alignment structures formed within the electro-optical die is positioned over and exposed to the cavity within the redistribution layer. The method also includes disposing a mold compound material over the redistribution layer and around the electro-optical die. A residual kerf region of the electro-optical die interfaces with the redistribution layer to prevent the mold compound material from entering into the plurality of optical fiber alignment structures and the cavity. The method also includes removing the carrier wafer from the redistribution layer. The method also includes cutting through the redistribution layer and the mold compound material to obtain an electro-optical chip package that includes the electro-optical die. The cutting is performed to remove the residual kerf region from the electro-optical die to expose the plurality of optical fiber alignment structures and the cavity at an edge of the electro-optical chip package.

In an example embodiment, an electro-optical chip package is disclosed. The electro-optical chip package includes a redistribution layer and an electro-optical die flip-chip connected to the redistribution layer. A portion of the electro-optical die extends laterally over an opening in the redistribution layer. The opening in the redistribution layer is formed along a portion of an outer lateral edge of the electro-optical chip package. The portion of the electro-optical die includes a plurality of optical fiber alignment structures that extend to an edge of the electro-optical die that corresponds to the portion of the outer lateral edge of the electro-optical chip package. The electro-optical chip package also includes a mold compound material disposed on the redistribution layer and partially around the electro-optical die. The mold compound material is not disposed within the plurality of optical fiber alignment structures. The mold compound material is also not disposed within the opening in the redistribution layer.

Other aspects and advantages of the invention will become more apparent from the following detailed description, taken in conjunction with the accompanying drawings, illustrating by way of example the present invention.

BRIEF DESCRIPTION OF THE DRAWINGS

FIG. 3D-2 shows a seed layer deposited on the release layer, in accordance with some embodiments.

FIG. 3D-3 shows a layer of patterned photoresist material with electrically conductive material deposited in the openings formed within the layer of patterned photoresist material, in accordance with some embodiments.

FIG. 3D-4 shows the configuration of FIG. 3D-3 after removal of the layer of patterned photoresist material and etching of the seed layer, in accordance with some embodiments.

FIG. 3D-5 shows the configuration of FIG. 3D-4 after deposition of a layer of dielectric material, in accordance with some embodiments.

FIG. 3D-6 shows an example build-up of multiple electrically conductive routing layers separated from each other by intervening dielectric material layers within the RDL structure, in accordance with some embodiments.

FIG. 3L shows a vertical cross-section view through the configuration of FIG. 3K, corresponding to View A-A, in accordance with some embodiments.

FIG. 3O shows a vertical cross-section view through the configuration of FIG. 3N, corresponding to View A-A, in accordance with some embodiments.

FIG. 3R shows a vertical cross-section view through the configuration of FIG. 3Q, corresponding to View A-A, in accordance with some embodiments.

FIG. 6 shows a flowchart of a method for packaging an electro-optical die, in accordance with some embodiments.

DETAILED DESCRIPTION

Figure 1A:
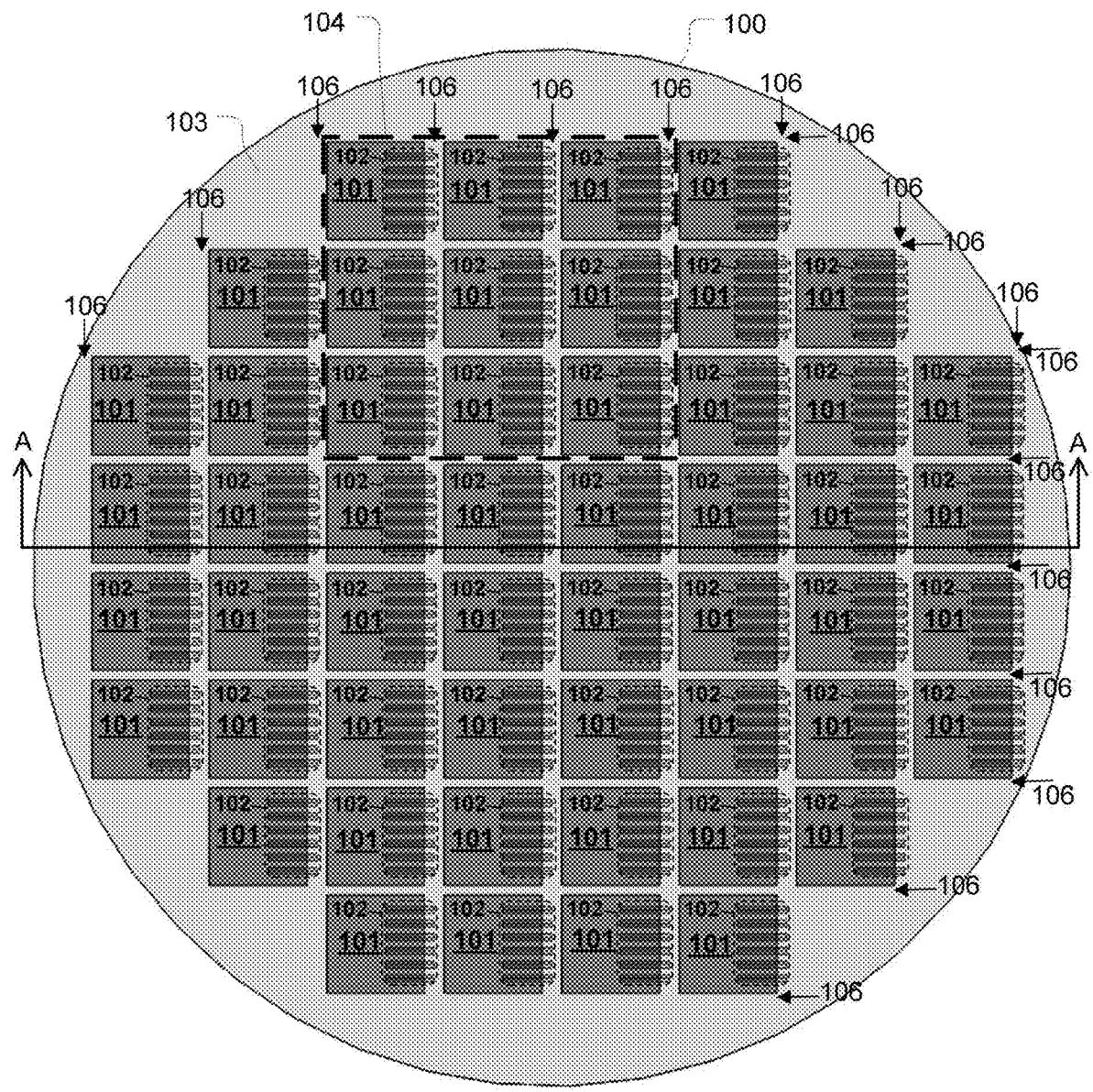
FIG. 1A shows a top view of a wafer that includes a number of electro-optical die, in accordance with some embodiments.

In the following description, numerous specific details are set forth in order to provide an understanding of the present invention. It will be apparent, however, to one skilled in the art that the present invention may be practiced without some or all of these specific details. In other instances, well known process operations have not been described in detail in order not to unnecessarily obscure the present invention.

Wafer-Level Fan-Out (WLFO), which is sometimes called Redistribution Layer (RDL) technology, is a die package assembly process. There are two approaches for WLFO, namely a chip-first approach and chip-last approach. In the chip-first approach, a reconstructed wafer is created that includes a plurality of singulated die/chips. It should be understood that each singulated die/chip corresponds to a semiconductor die/chip that has already been fabricated as part of a semiconductor wafer and that has been singulated, or separated, from the semiconductor wafer by dicing, cutting, breaking, etching, and/or another semiconductor wafer singulation technique. In the reconstructed wafer, the plurality of singulated die/chips are bound together with an adhesive material, such as an epoxy or other similar adhesive material. In some embodiments, the adhesive material is referred to as a mold compound material. After the reconstructed wafer is formed by adhering the plurality of singulated die/chips together using the mold compound material, an RDL structure is fabricated over the plurality of die/chips and over the mold compound material. The RDL structure includes an arrangement of electrically conductive structures separated by intervening dielectric material. The arrangement of electrically conductive structures within the RDL structure functions, at least in-part, to electrically route externally exposed electrical terminals of a given die/chip to corresponding electrical terminals distributed within an area larger than an area of the given die/chip, so as to enable electrical connection of the given die/chip to another electrical device. Also, in some embodiments, the RDL structure includes some electrical connections that provide for electrical communication through the RDL structure between multiple die/chips that are connected to the RDL structure. In some embodiments, a pattern of conductors and dielectric layers that are fabricated within the RDL structure over a given die/chip within the reconstructed wafer define a single die package (SDP) that includes the given die/chip. In some embodiments, a pattern of conductors and dielectric layers that are fabricated within the RDL structure over a given plurality of die/chips within the reconstructed wafer define a multi-chip package (MCP) that includes the given plurality of die/chips. After the SDP's and/or MCP's are formed, the reconstructed wafer is cut to obtain finished SDP's and/or MCP's in individual form.

In the chip-last approach, which is also referred to as an RDL-first approach, an RDL substrate is first fabricated to include the RDL structures. In various embodiments, the RDL substrate is fabricated as a semiconductor wafer or a panel or another planar-type substrate. After the RDL substrate is fabricated, the plurality of singulated die/chips are flip-chip connected to the RDL substrate, such that electrical terminals of each of the plurality of die/chips are electrically connected to appropriate electrical conductors within the RDL substrate, and such that the plurality of die/chips are physically attached to the RDL substrate. After the die/chips are flip-chip connected to the RDL-substrate, the die/chips and RDL-substrate are covered with a mold compound material, which serves to strengthen, protect, and give body to package assemblies (SDP's and/or MCP's) that are to be obtained from the RDL substrate. The RDL-substrate having the die/chips flip-chip connected thereto and having the mold compound material disposed thereon is then cut to obtain finished SDP's and/or MCP's in individual form. Conventional chip-first and chip-last approaches for WLFO are not compatible with packaging of semiconductor die/chips to which optical fibers are attached/connected. Various embodiments are disclosed herein to enable integration of edge-coupled fiber optics to one or more die/chip(s) within a WLFO-type of die package assembly technology, or similar type of die package assembly technology.

In various silicon photonic devices used in the silicon photonics industry for optical data communication, one or more optical fiber(s) is/are coupled to a semiconductor die/chip so that light (continuous wave (CW) light and/or modulated light) can be transmitted from the one or more optical fiber(s) into the semiconductor die/chip and/or transmitted from the semiconductor die/chip into the one or more optical fiber(s). For ease of description the term semiconductor die as used herein refers to both a semiconductor die and a semiconductor chip. Also, in various embodiments the semiconductor die referred to herein includes electrical devices, optical devices, electro-optical devices, and/or thermo-optical devices, and corresponding electrical and optical circuitry. The semiconductor die referred to herein corresponds to any photonic-equipped die to which one or more optical fiber(s) is/are connected to provide for transmission of light into and/or out of the semiconductor die. The coupling of an optical fiber to a semiconductor die is referred to as fiber-to-chip coupling. In some embodiments, the semiconductor die includes integrated optical fiber alignment structures, such as v-grooves and/or channel, among others, configured to facilitate attachment of optical fibers to the semiconductor die. In some semiconductor die packaging embodiments, in-package optical interconnect relies on 2.5D or 2.1D interposer-type packaging technology. Also, in some semiconductor die packaging embodiments, either a 3D packaging approach, e.g., die stacking, or a wire-bonding approach is utilized.

The term "light" as used herein refers to electromagnetic radiation within a portion of the electromagnetic spectrum that is usable by optical data communication systems. The term "wavelength," as used herein, refers to the wavelength of electromagnetic radiation. In some embodiments, the portion of the electromagnetic spectrum includes light having wavelengths within a range extending from about 1100 nanometers to about 1565 nanometers (covering from the O-Band to the C-Band, inclusively, of the electromagnetic spectrum). However, it should be understood that the portion of the electromagnetic spectrum as referred to herein can include light having wavelengths either less than 1100 nanometers or greater than 1565 nanometers, so long as the light is usable by an optical data communication system for encoding, transmission, and decoding of digital data through modulation/de-modulation of the light. In some embodiments, the light used in optical data communication systems has wavelengths in the near-infrared portion of the electromagnetic spectrum.

Figure 1B:
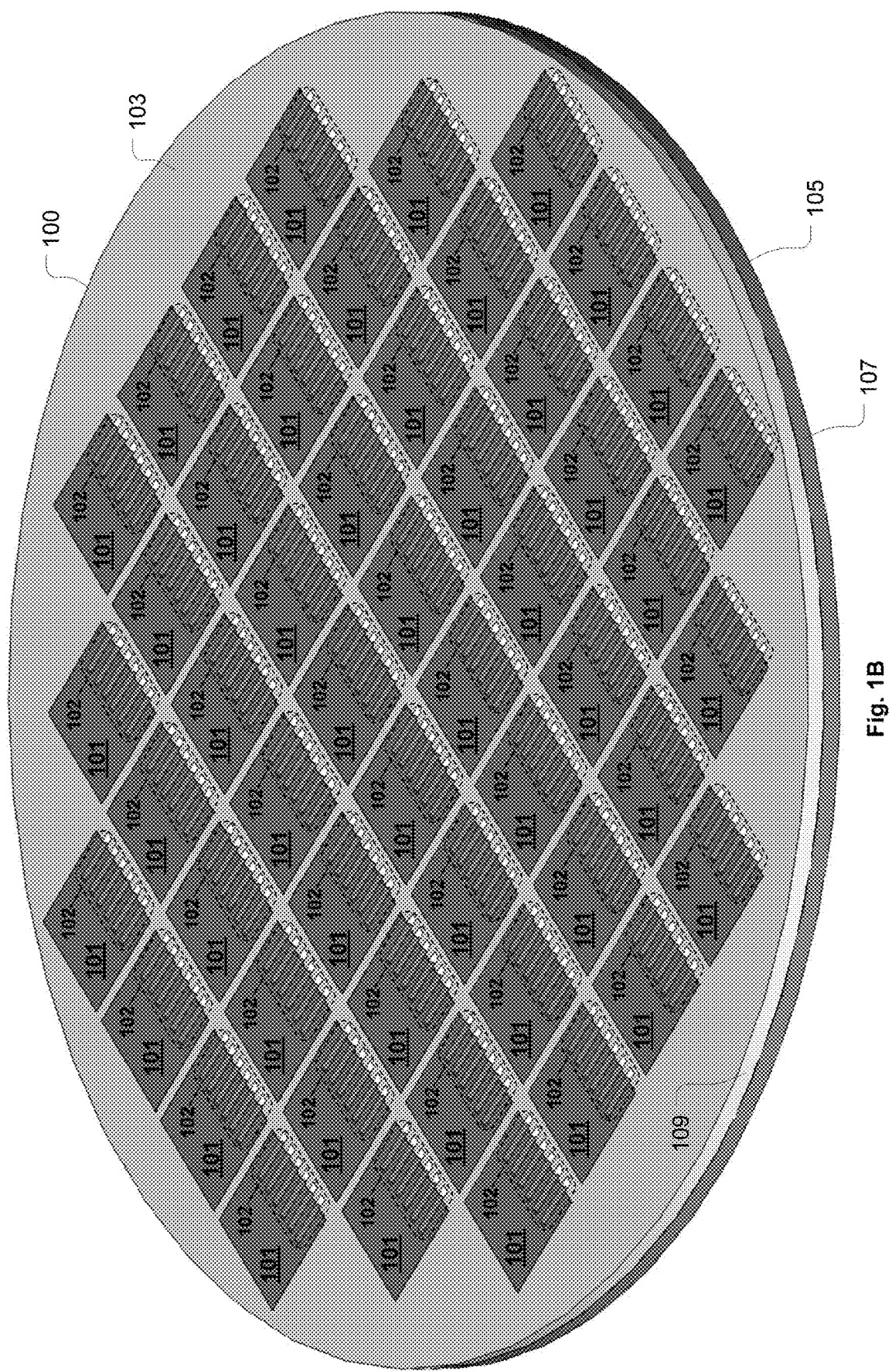
FIG. 1B shows an isometric top view of the wafer of FIG. 1A, in accordance with some embodiments.
Figure 1C:
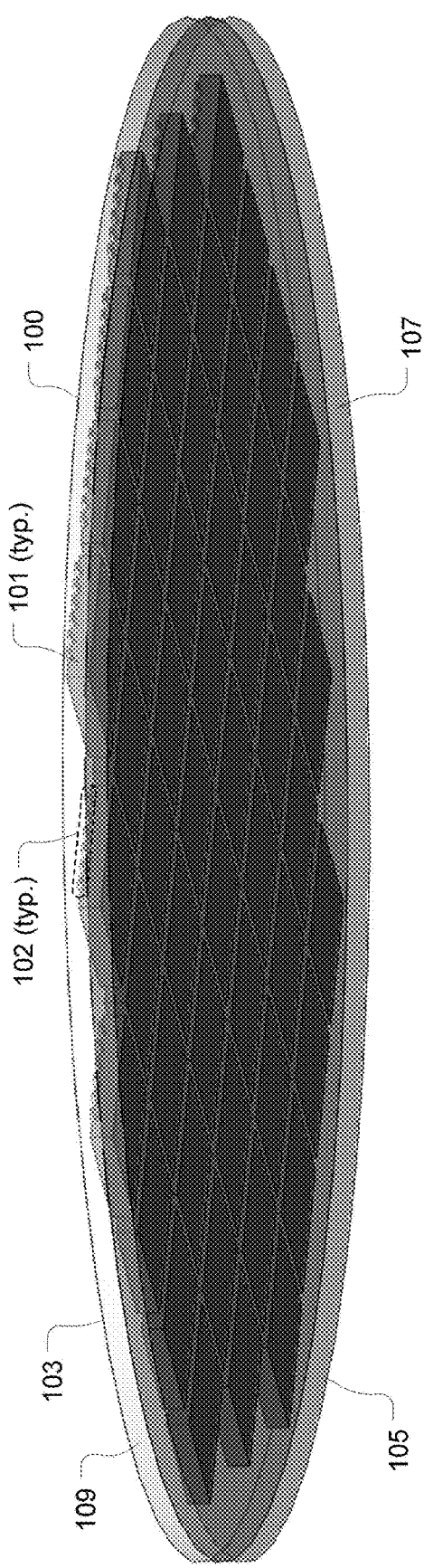
FIG. 1C shows a perspective bottom view of the wafer of FIG. 1A, in accordance with some embodiments.
Figure 1D:
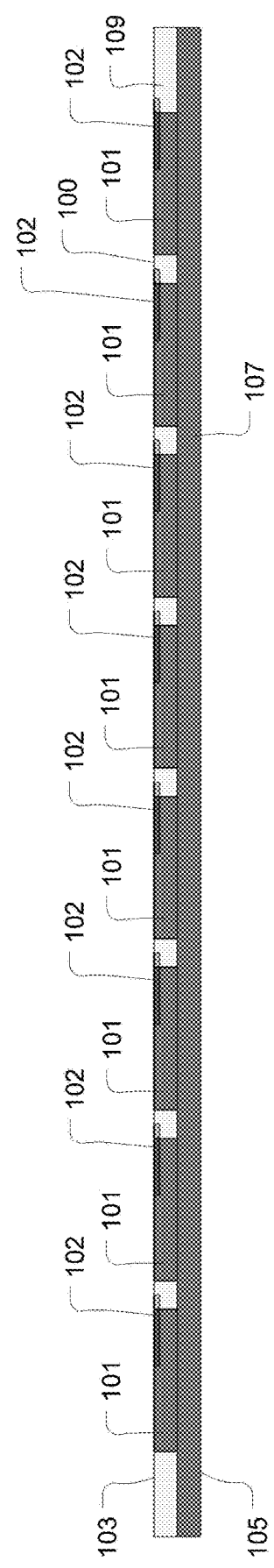
FIG. 1D show a vertical cross-section view through the wafer of FIG. 1A, corresponding to View A-A, in accordance with some embodiments.

FIG. 1A shows a top view of a wafer 100 that includes a number of electro-optical die 101, in accordance with some embodiments. FIG. 1B shows an isometric top view of the wafer 100, in accordance with some embodiments. Each die 101 includes electronic integrated circuits and optical (photonic) devices. The wafer 100 has a top surface 103 and a bottom surface 105. It should be understood that the top surface 103 of the wafer 100 corresponds to the side of the wafer 100 on which semiconductor fabrication processes are performed to deposit, remove, modify, and shape various materials to fabricate the die 101. It should be understood that the bottom surface 105 of the wafer 100 corresponds to the bottom side of a base substrate 107, e.g., silicon substrate, with the die 101 fabricated on top of the base substrate 107. The base substrate 107 extends into the wafer 100 from the bottom surface 105. The wafer also includes a front region 109 that extends into the wafer 100 from the top surface 103. FIG. 1C shows a perspective bottom view of the wafer 100, with the base substrate 107 and the front region 109 shown in a transparent manner to reveal the die 101, in accordance with some embodiments. FIG. 1D show a vertical cross-section view through the wafer 100, corresponding to View A-A identified in FIG. 1A, in accordance with some embodiments. The front region 109 includes the die 101 which are formed to include interlevel dielectric (silicon dioxide, silicon nitride, and/or permutations of silicon dioxide such as SiCOH, etc.), electrical interconnect (e.g., back end of line aluminum, tungsten, and/or copper wires), and semiconductor devices and transistors (e.g., silicon body plus Buried Oxide (BOX) for a Silicon-on-Insulator (SOI) wafer, and/or bulk Complementary Metal-Oxide Semiconductor (CMOS) down to Shallow Trench Isolation (STI) for a bulk CMOS wafer). In some embodiments, the wafer 100 is a SOI wafer, and a lower portion of the front region 109 includes a Buried Oxide (BOX) region. In some embodiments, the wafer 100 is a CMOS wafer, and the lower portion of the front region 109 includes a Shallow Trench Isolation (STI) region. In some embodiments, the base substrate 107 of the wafer 100 is formed of silicon. In some embodiments, the wafer 100 is a SOI wafer, and the base substrate 107 is the handle silicon located below the BOX material in the lower portion of the front region 109. In some embodiments, the wafer 100 is a CMOS wafer, and the base substrate 107 is the silicon located below the STI structures within the lower portion of the front region 109.

In various embodiments, the wafer 100 is essentially any type of semiconductor wafer or semiconductor panel within which one or more die 101 is/are manufactured. In various embodiments, the wafer 100 has various geometric shapes, such as a circular disc shape or a rectangular slab shape, among other shapes. Also, it should be understood that the number and arrangement of die 101 on the wafer 100 is provided by way of example. In various embodiments, the number and arrangement of die 101 on the wafer 100 can differ from what is shown in the example of FIGS. 1A-1D. Also, it should be understood that the various structures and components depicted in FIGS. 1A-1D are not drawn to scale, but rather are sized to facilitate description. Also, for purposes of description, the wafer 100 as shown in FIGS. 1A-1D exists in a state in which fabrication of the die 101 on the wafer 100 has been completed and the wafer 100 is ready for singulation (also referred to as dicing and/or cutting, among others) to obtain/release the individual die 101 from the wafer 100.

In some embodiments, each of the die 101 is a silicon photonics die that includes optical devices and/or electro-optical devices and/or thermo-optical devices. In some embodiments, one or more of the die 101 is a TeraPHY™ semiconductor chip as provided by Ayar Labs, Inc. of Santa Clara, California, as described in U.S. patent application Ser. No. 16/510,821, which is incorporated herein by reference in its entirety. However, it should be understood that implementation of each of the die 101 as the TeraPHY™ semiconductor chip is provided by way of example. In various embodiments, each of the die 101 is essentially any type of photonics chip, whether it be the TeraPHY™ semiconductor chip or another type of photonics chip. Each of the die 101 has a front-side (or circuit-side) and a back-side (or substrate-side). The die 101 is also referred to as an integrated circuit die. In some embodiments, the die 101 is fabricated of silicon, and includes transistors (e.g., CMOS, NMOS, PMOS, BJT, NPN, PNP, etc.), optical waveguides, and photonic components (e.g., optical couplers, optical modulators, optical splitters, photodetectors, among others). In some embodiments, the front side of the die 101 has a seal region in which a chip seal is formed as one or more circuitous and contiguous metal lines. In some embodiments, the chip seal is formed from the Back-End-Of-Line (BEOL) metals. Also, in some embodiments, the die 101 includes multiple chip seals.

It should be understood that light may be confined to propagate through various optical waveguides formed within the die 101. In some embodiments, the light is polarized. In some embodiments, the light is not polarized. In some embodiments, the light is continuous wave light, such as light generated by a laser. In some embodiments, the light is modulated light that conveys digital data. In some embodiments, the light has a particular wavelength, where the particular wavelength refers to either essentially one wavelength or a narrow band of wavelengths that can be identified and processed by an optical data communication system as if it were a single wavelength.

In various embodiments, each of the die 101 is an integrated circuit chip/die, and/or essentially any other electronic chip/die, and/or a photonic chip/die, and/or an electro-optical chip/die, and/or any other photonic-equipped chip/die to which one or more optical fibers is/are intended to be optically coupled upon packaging and/or installation of the die 101 to provide for transmission of light from the optical fiber(s) to corresponding optical waveguide(s) within the die 101, and/or vice-versa. In various embodiments, each of the die 101 is either a thin-BOX SOI chip/die, a thick-BOX SOI chip/die, and/or bulk CMOS chip/die, among other types of semiconductor chips/die. It should be understood that the terms chip and die, as used herein are interchangeable. Also, in various embodiments the die 101 includes electrical devices, optical devices, electro-optical devices, and/or thermo-optical devices, and corresponding electrical and optical circuitry.

In some embodiments, a reticle field 104 used in photolithography processes to fabricate the die 101 on the wafer 100 is defined to include one or more of the die 101. In some embodiments, the reticle field 104 spans a plurality of the die 101 on the wafer 100. For example, in some embodiments, the reticle field 104 spans a three-by-three array of die 101 on the wafer 100, such that the reticle field photolithographically patterns nine die 101 at a time. In some embodiments, the reticle field is defined to span either more or less than nine die 101. The reticle field is positioned/stepped at different locations over the wafer 100 to provide for fabrication of the die 101 across the wafer 100.

In some embodiments, each of the die 101 is configured for optical connection to an optical fiber array and/or to a photonics optical waveguide. For example, in some embodiments, silicon photonics waveguides within the die 101 are formed in the body silicon of the wafer 100 that exists above the lower portion of the front region 109 of the wafer 100, e.g., above the BOX region within the lower portion of the front region 109 of the wafer 100 formed as a SOI wafer. Some of the silicon photonics waveguides within the die 101 are daylighted (exposed) at an exterior surface of the die 101 to enable optical coupling of corresponding optical fibers with the silicon photonics waveguides. In the example embodiments of FIGS. 1A-1D, each die 101 includes a set of optical fiber alignment structures 102 formed within the top surface of the die 101 to facilitate connection of optical fibers to the die 101 and to facilitate proper alignment of a core of each optical fiber to a corresponding optical waveguide (or optical grating coupler, or other similar device) within the die 101. The top (front-side) surfaces of the die 101 correspond to the top surface 103 of the wafer 100. In some embodiments, the set of optical fiber alignment structures 102 of a given die 101 includes a number of v-groove structures formed within the top surfaces of the die 101. In some embodiments, the set of optical fiber alignment structures 102 includes a number of channels, such as rectangular-shaped channels and/or polygonal-shaped channels, formed within the top surfaces of the die 101.

The die 101 are separated from each other within the wafer 100 by kerf regions 106, also referred to as scribe line regions and/or dicing channels and/or scribe streets and/or streets, among others. The kerf regions 106 are usually formed so that the portions of the wafer corresponding to the kerf regions 106 are substantially eliminated when the wafer is cut along the kerf regions 106. However, in the embodiments disclosed herein, some of the kerf regions 106 are enlarged so that some portions of the kerf regions 106 will remain attached to the die 101 after the wafer 100 is cut along the kerf regions 106. The portions of the kerf regions 106 that remain attached to the die 101 are referred to as residual kerf regions. It should be understood that each set of optical fiber alignment structures 102 formed within a given die 101 is sized and positioned to extend into a portion of a residual kerf region located adjacent to a side (peripheral/lateral edge) of the given die 101, where the portion of the residual kerf region located adjacent to the side of the given die 101 remains attached to the given die 101 when the wafer 100 is cut along the kerf regions 106.

Figure 1E:
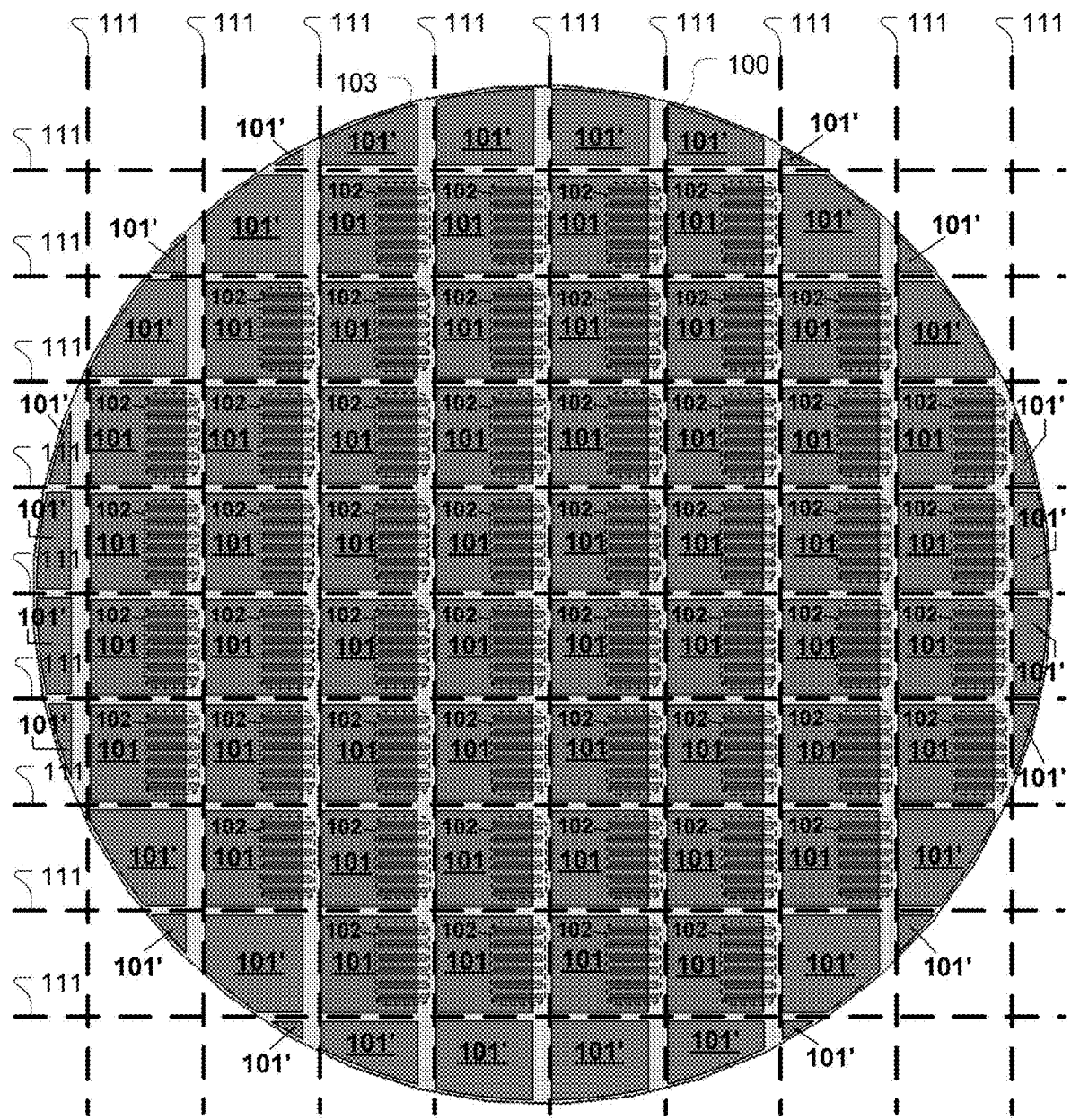
FIG. 1E shows the top view of the wafer of FIG. 1A with cutting paths extending along the kerf regions of the wafer, in accordance with some embodiments.

FIG. 1E shows the top view of the wafer 100 of FIG. 1A with cutting paths 111 extending along the kerf regions 106 of the wafer 100, in accordance with some embodiments. FIG. 1E represents the wafer 100 in an intact state in which the base substrate 107 is unbroken/uncut across the wafer 100. For ease of description, the wafer 100 in the intact state is referred to as an intact wafer. After fabrication of the die 101 is complete, the wafer 100 is diced along the cutting paths 111 to obtain the individual die 101 as physically separate structures in a process referred to as die singulation. In various embodiments, dicing of the wafer 100 along the cutting paths 111 is done in different ways, such as by mechanical cutting, plasma cutting, etching, plasma etching, laser cutting, stealth dicing, laser ablation, deep reaction ion etching, scribe-and-break processing, among others. Modern wafer 100 dicing processes are capable of satisfying micrometer-level tolerances on the sizes and locations of the cuts made to the wafer 100 along the cutting paths 111. Therefore, in some embodiments, at least micrometer-level accuracy is achievable with regard to the size and shape of individual die 101 released from the wafer 100 in the die singulation process.

FIG. 1E also shows that in some embodiments there are also a number of partially formed die 101' located at and around the radial periphery of the wafer 100. It should be understood that the portion of the base substrate 107 below a given die 101 belongs to the given die 101 when the wafer 100 is diced along the cutting paths 111 to release the die 101 in individual form. Also, the portion of the base substrate 107 below a given partially formed die 101' belongs to the given partially formed die 101' when the wafer 100 is diced along the cutting paths 111 to release the die 101 in individual form.

Figure 2A:
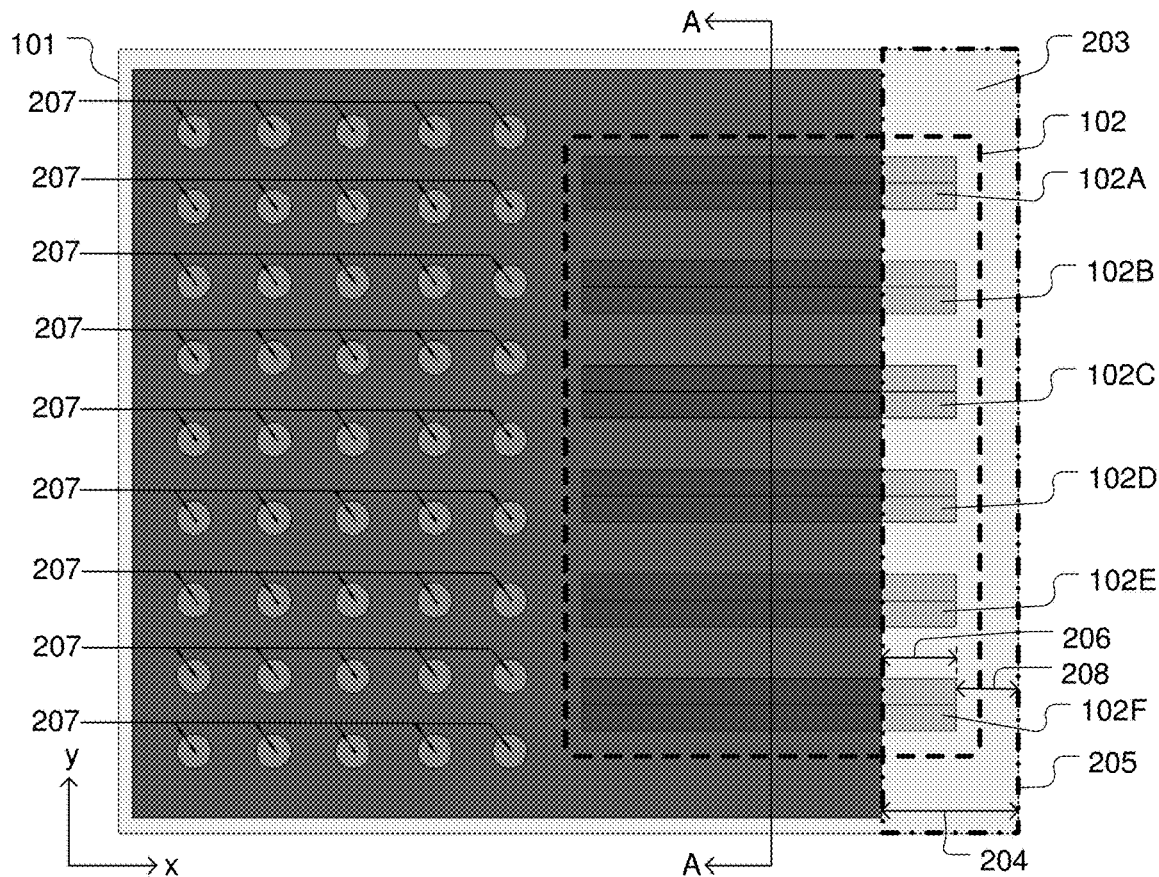
FIG. 2A shows a top view of a singulated instance of the die from the wafer of FIG. 1E, in accordance with some embodiments.
Figure 2B:
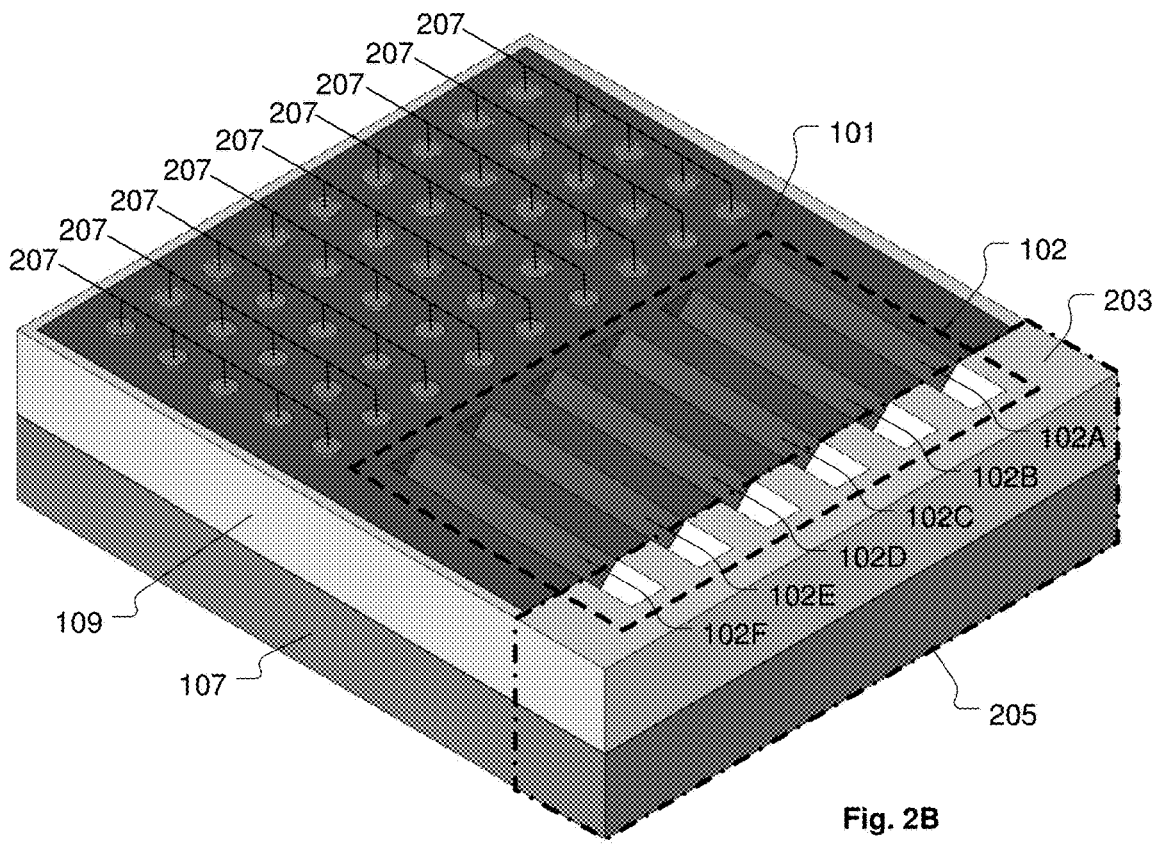
FIG. 2B shows an isometric top view of the singulated die of FIG. 2A, in accordance with some embodiments.
Figure 2C:
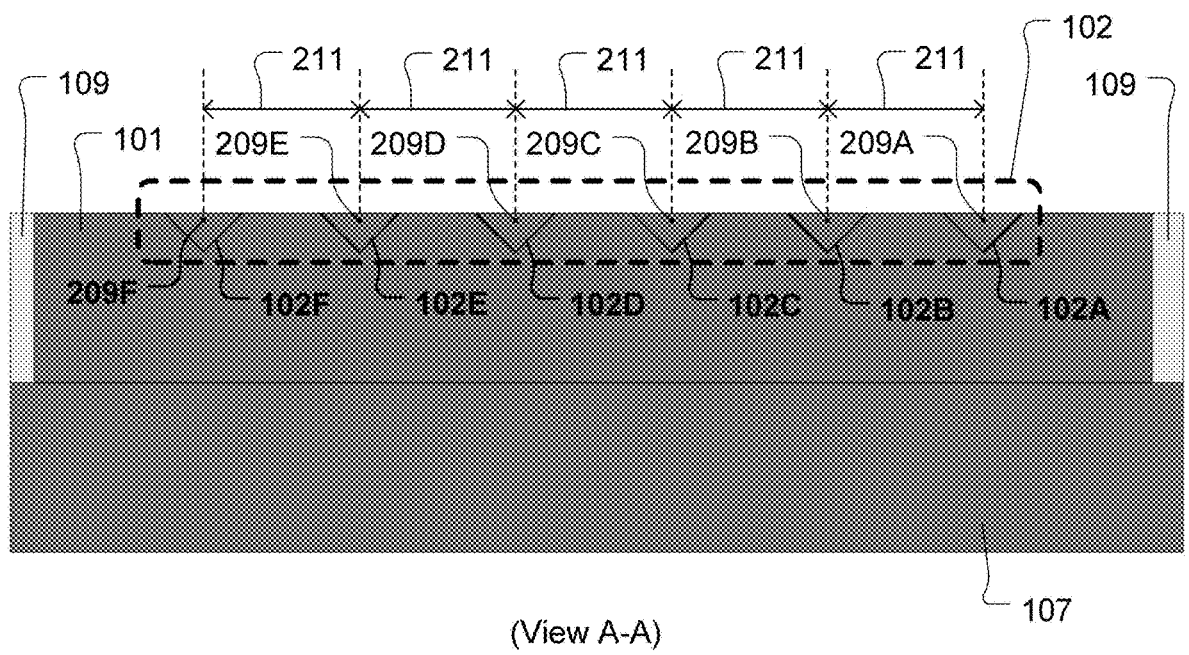
FIG. 2C shows a vertical cross-section view through the singulated die of FIG. 2A, corresponding to View A-A, in accordance with some embodiments.

FIG. 2A shows a top view of a singulated instance of the die 101, in accordance with some embodiments. The singulated die 101 of FIG. 2A corresponds to one of the die 101 released from the wafer 100 of FIG. 1E when the wafer 100 is cut along the cutting paths 111. FIG. 2B shows an isometric top view of the singulated die 101, in accordance with some embodiments. FIG. 2C shows a vertical cross-section view through the singulated die 101, corresponding to View A-A identified in FIG. 2A, in accordance with some embodiments. It should be understood that the various structures and components depicted in FIGS. 2A-2C are not drawn to scale, but rather are sized to facilitate description. The die 101 includes exposed electrically conductive contact pads 207 configured to enable flip-chip connection of the die 101 to a packaging structure, such as an RDL structure. It should be understood that the cutting paths 111 are arranged on the wafer 100 so that a residual kerf region 203 exists on the die 101 in its singulated form. The residual kerf region 203 is located adjacent to an edge of the die 101. FIGS. 2A-2C show the set of optical fiber alignment structures 102 as including optical fiber alignment structures 102A-102F, by way of example. It should be understood that in various embodiments, the set of optical fiber alignment structures 102 can include essentially any number and configuration of optical fiber alignment structures. Therefore, it should be understood that the number and configuration of the optical fiber alignment structures 102A-102F as described herein is provided as an example and can be replaced with any other number and/or configuration of optical fiber alignment structures in various embodiments.

Each of the optical fiber alignment structures 102A-102F within the set of optical fiber alignment structures 102 is formed to extend into the residual kerf region 203. The wafer 100 is cut/diced so that a portion of the residual kerf region 203 exists between an outer end of each of the optical fiber alignment structures 102A-102F and a neighboring outer edge of the die 101. For example, the dicing blade is applied to cut the wafer 100 along the cutting lines 111 while avoiding contact with the optical fiber alignment structures 102A-102F. In this manner, the residual kerf region 203 includes a contiguous outer portion that laterally bounds/encapsulates the ends of the optical fiber alignment structures 102A-102F present within the residual kerf region 203. As discussed in more detail below, the contiguous outer portion of the residual kerf region 203 functions as a dam region to prevent mold compound material from entering into the optical fiber alignment structures 102A-102F during subsequent packaging of the die 101. In some embodiments, the residual kerf region 203 has a size 204 as measured in the x-direction, as shown in FIG. 2A, that is greater than zero and up to about 210 micrometers. In some embodiments, the size 204 of the residual kerf region 203 as measured in the x-direction is larger than about 210 micrometers. For example, in some embodiments, the size 204 of the residual kerf region 203 is within a non-zero range extending up to about 300 micrometers, or up to about 400 micrometers, or up to about 500 micrometers. In some embodiments, the size 204 of the residual kerf region 203 is within a range extending from about 300 micrometers to about 500 micrometers. Also, in some embodiments, the size 204 of the residual kerf region 203 is greater than about 500 micrometers. The term "about" as used herein represents a range extending from minus ten percent of a given value to plus ten percent of the given value.

As shown in the example of FIG. 2C, in some embodiments, the set of optical fiber alignment structures 102 includes multiple v-grooves (e.g., 102A-102F) positioned in a side-by-side arrangement and oriented to extend parallel to each other in a first direction (x-direction as shown in FIG. 2A) that is perpendicular to the edge of the electro-optical die 101 along which the residual kerf region 203 exists. In some embodiments, the multiple v-grooves (e.g., 102A-102F) are positioned in accordance with a substantially equal center-to-center spacing 211 (pitch) as measured in a second direction (y-direction as shown in FIG. 2A) between each adjacent pair of the multiple v-grooves. In some embodiments, the v-grooves (e.g., 102A-102F) extend in the x-direction into the residual kerf region 203 by a non-zero distance 206, such that at least some amount (some end portion) of each of the v-grooves (e.g., 102A-102F) extends into the residual kerf region 203. In some embodiments, the distance 206 is within a range extending from about 150 micrometers to about 250 micrometers. In some embodiments, the distance 206 is about 195 micrometers. Also, in some embodiments, the size 204 of the residual kerf region 203 and the distance 206 of extension of the v-grooves (e.g., 102A-102F) into the residual kerf region 203 are collectively controlled such that the residual kerf region 203 provides a dam thickness size 208, as measured in the x-direction, that is greater than zero and sufficiently large to prevent fracture of the residual kerf region 203 when external pressure is applied to the electro-optical die 101 during subsequent fabrication processes, such as when mold compound material 323 is disposed over the electro-optical die 101 as described below with regard to FIG. 3K. In some embodiments, the dam thickness size 208 is within a range extending from about 150 micrometers to about 350 micrometers. In some embodiments, the dam thickness size 208 is made as small as possible while ensuring that the dam thickness size 208 remains large enough to prevent fracture of the residual kerf region 203 when exposed to external mechanical force, such as caused by a pressure differential between the exterior of the electro-optical die 101 and the open spaces within the v-grooves (e.g., 102A-102F).

Each of the optical fiber alignment structures 102A-102F (e.g., v-grooves) is formed to receive a corresponding optical fiber, such that a core of the optical fiber is optically aligned and coupled with a corresponding optical waveguide 209A-209F (or optical grating coupler), respectively, within the die 101. More specifically, the optical fiber alignment structures 102A-102F are formed to facilitate positioning, alignment, and connection of optical fibers to the die 101, such that when the optical fibers are properly positioned with the optical fiber alignment structures 102A-102F, the cores of the optical fibers are respectively optically edge coupled to in-plane (edge) fiber-to-chip optical couplers within the die 101. In this manner, light can be coupled from the optical fibers into the in-plane (edge) fiber-to-chip optical couplers of the die 101, and/or vice-versa.

In some embodiments, the v-grooves (e.g., 102A-102F) are etched into the die 101. In various embodiments, the number of v-grooves (e.g., 102A-102F), the pitch 211 between adjacent v-grooves (e.g., 102A-102F), and/or any other property of the v-grooves (e.g., 102A-102F) is customizable for the application. Also, for ease of description, the example die 101 shows the v-grooves (e.g., 102A-102F) positioned along one side of the die 101. However, it should be understood that in some embodiments the v-grooves (e.g., 102A-102F) are positioned along more than one side of the die 101. Also, it should be understood that each side of the die 101 along which v-grooves (e.g., 102A-102F) are positioned includes a corresponding residual kerf region like the above-described residual kerf region 203. Also, in some embodiments, each side of the die 101 along which v-grooves (e.g., 102A-102F) are not positioned may not have a corresponding residual kerf region.

Figure 3A:
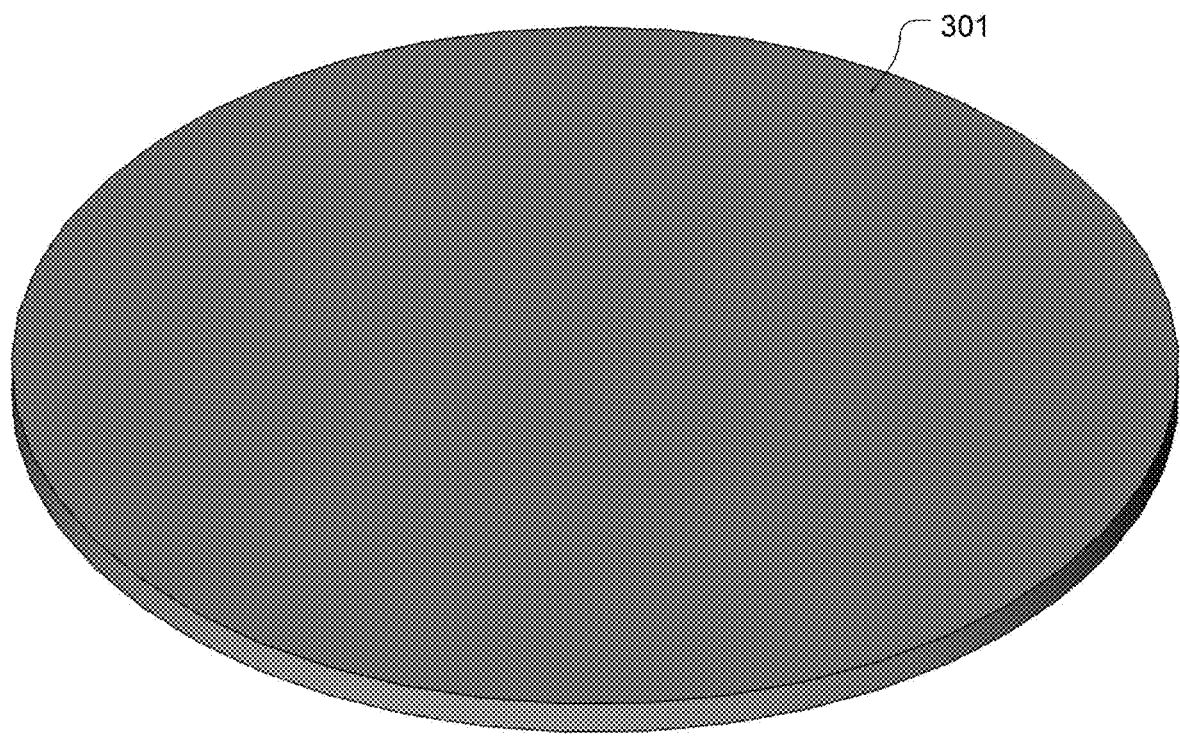
FIG. 3A shows a top isometric view of a carrier wafer, in accordance with some embodiments.
Figure 3B:
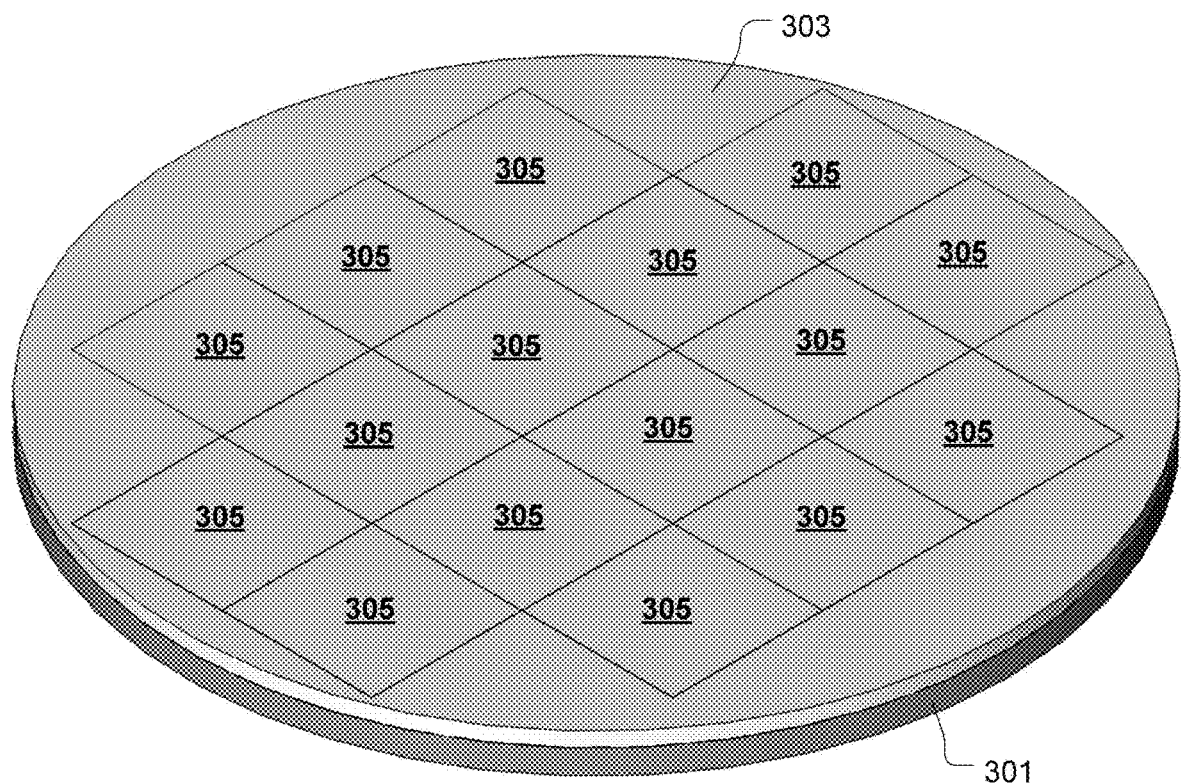
FIG. 3B shows a top isometric view of a WLFO assembly fabricated on the carrier wafer, in accordance with some embodiments.
Figure 3C:
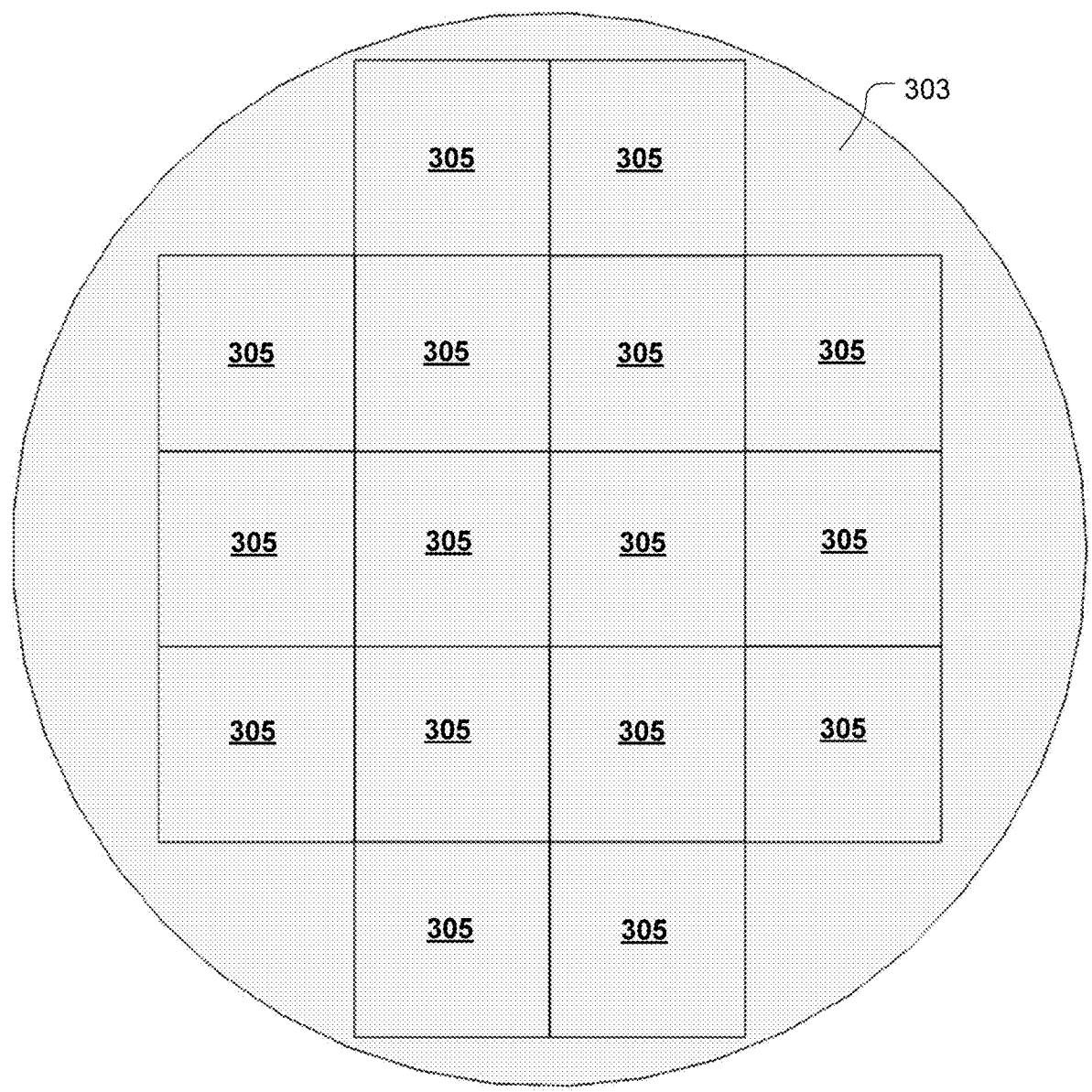
FIG. 3C shows a top view of the WLFO assembly, in accordance with some embodiments.
Figures 1, 3D:
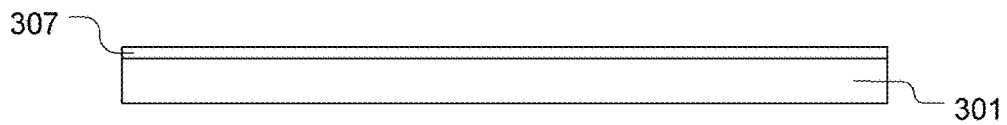
FIG. 3D-1 shows the carrier wafer with a release layer disposed on the carrier wafer, in accordance with some embodiments.
Figures 2, 3D:
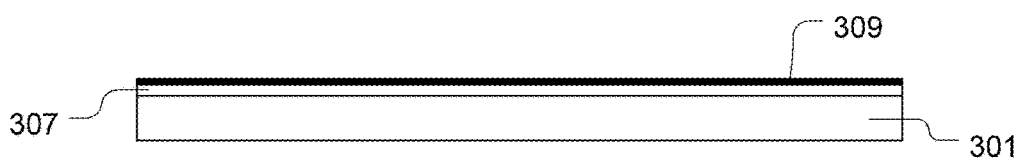
Figures 3, 3D:
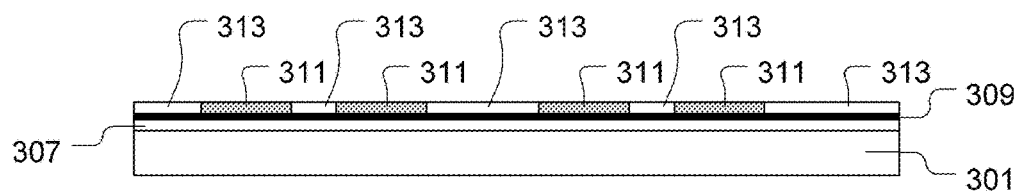
Figures 3, 3D, 4:
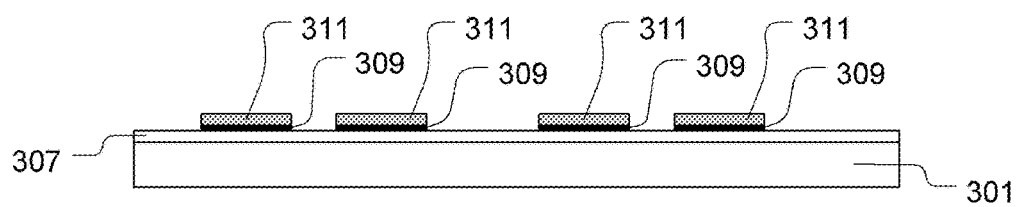
Figures 3, 3D, 4, 5:
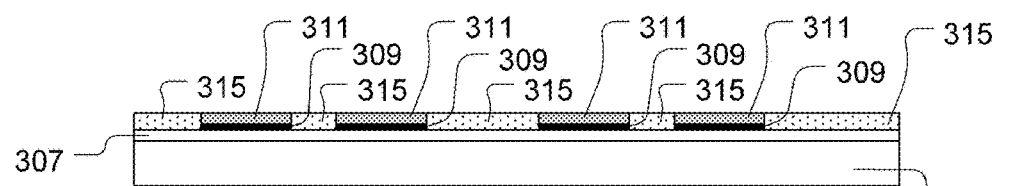

As part of the chip-last WLFO packaging embodiments disclosed herein, a WLFO assembly 303 is fabricated on a carrier wafer 301. FIG. 3A shows a top isometric view of the carrier wafer 301, in accordance with some embodiments. FIG. 3B shows a top isometric view of the WLFO assembly 303 fabricated on the carrier wafer 301, in accordance with some embodiments. FIG. 3C shows a top view of the WLFO assembly 303, in accordance with some embodiments. The WLFO assembly 303 includes RDL structures 305 configured for SDP's and/or MCP's. In some embodiments, the RDL structures 305 provide the metal and dielectric interconnect structures present in SDP's and/or MCP's. FIGS. 3D-1 through 3D-6 show a series of vertical cross-section views through a portion of an example build-up of the RDL structure 305 on the carrier wafer 301, in accordance with some embodiments. FIG. 3D-1 shows the carrier wafer 301 with a release layer 307 disposed on the carrier wafer 301, in accordance with some embodiments. FIG. 3D-2 shows a seed layer 309 deposited on the release layer 307, in accordance with some embodiments. FIG. 3D-3 shows a layer of patterned photoresist material 313 with electrically conductive material 311, such as copper or other material, deposited in the openings formed within the layer of patterned photoresist material 313, in accordance with some embodiments. FIG. 3D-4 shows the configuration of FIG. 3D-3 after removal of the layer of patterned photoresist material 313 and etching of the seed layer 309, in accordance with some embodiments. FIG. 3D-5 shows the configuration of FIG. 3D-4 after deposition of a layer of dielectric material 315, such as polyimide, in accordance with some embodiments. In some embodiments, the processes shown in FIGS. 3D-2 through 3D-4 are repeated to build-up multiple electrically conductive routing layers separated from each other by intervening dielectric material layers, where the one or more electrically conductive routing layers include electrically conductive traces configured to distribute electrical connections of input/output pads of an electro-optical die to respective locations within an area larger than the electro-optical die, and/or to provide electrical connections between multiple die connected to the RDL structure 305. FIG. 3D-6 shows an example build-up of multiple electrically conductive routing layers 311A separated from each other by intervening dielectric material layers 315A within the RDL structure 305, in accordance with some embodiments. The electrically conductive routing layers 311A are electrically connected to corresponding electrically conductive contact pads 317 that are exposed at the top surface of the RDL structure 305. In some embodiments, the dielectric material layers 315A within the RDL structure 305 include polyimide and/or other polymer material(s). In some embodiments, the electrically conductive routing layers 311A within the RDL structure 305 are formed of copper, such as deposited in dual damascene fabrication processes. However, in other embodiments, the electrically conductive routing layers 311A within the RDL structure 305 can be formed of essentially any metal or alloy that is used in semiconductor chip packaging technologies. In some embodiments, the RDL structure 305 has a stack thickness of about 12 micrometers. However, in other embodiments, the stack thickness of the RDL structure 305 is either less than or greater than about 12 micrometers.

It should be understood that the series of processes depicted in FIGS. 3D-1 through 3D-6 are provided by way of example. In various embodiments, the RDL structure 305 can be designed and fabricated in accordance with essentially any RDL structure technology/approach known the in the semiconductor chip packaging industry. Also, in various embodiments, the electrical routings within/through the RDL structure 305 can have essentially any configuration as needed for a given implementation of the chip-last WLFO embodiments disclosed herein to fabricate a given SDP and/or MCP. In various embodiments, the electrically conductive routing layers 311A within the RDL structures 305 are configured to provide for in-package electrical data communication and electrical power distribution. In some embodiments, the electrically conductive routing layers 311A within the RDL structures 305 are configured to provide for implementation of electrical serialization/deserialization (SerDes) interfaces, such as High Bandwidth Memory (HBM) interfaces and/or Advanced Interface Bus (AIB) interfaces, among other type of interfaces used in semiconductor chip design.

Figures 3, 3D, 4, 5, 6:
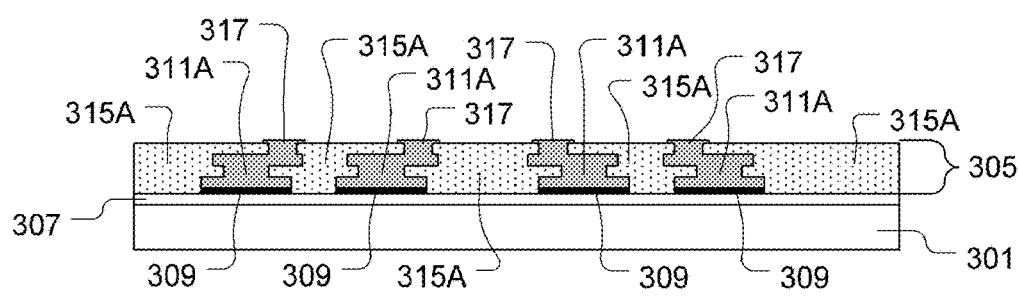
Figure 3E:
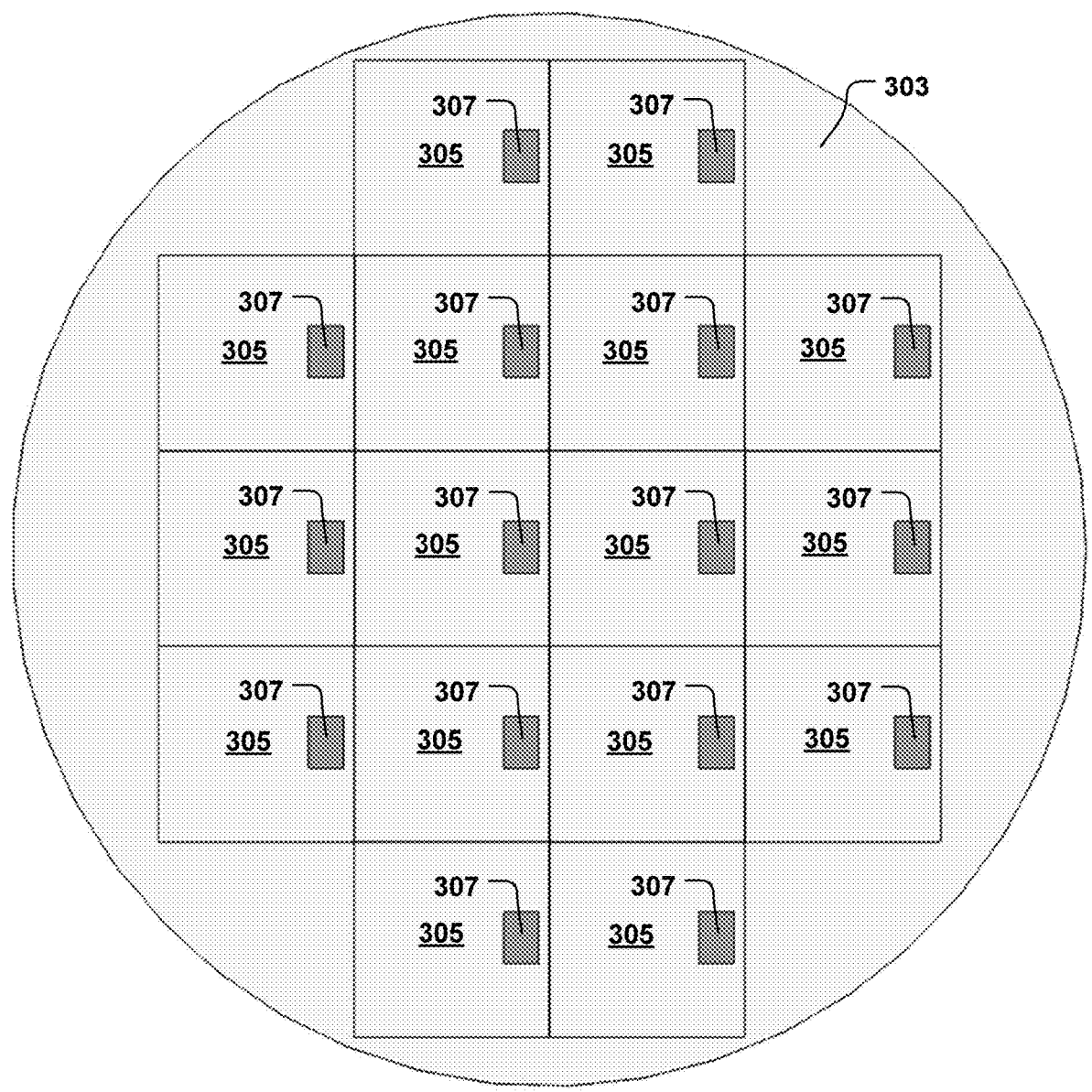
FIG. 3E shows a top view of the RDL structures on the carrier wafer with cavities (holes) etched through the RDL structures, in accordance with some embodiments.
Figure 3F:
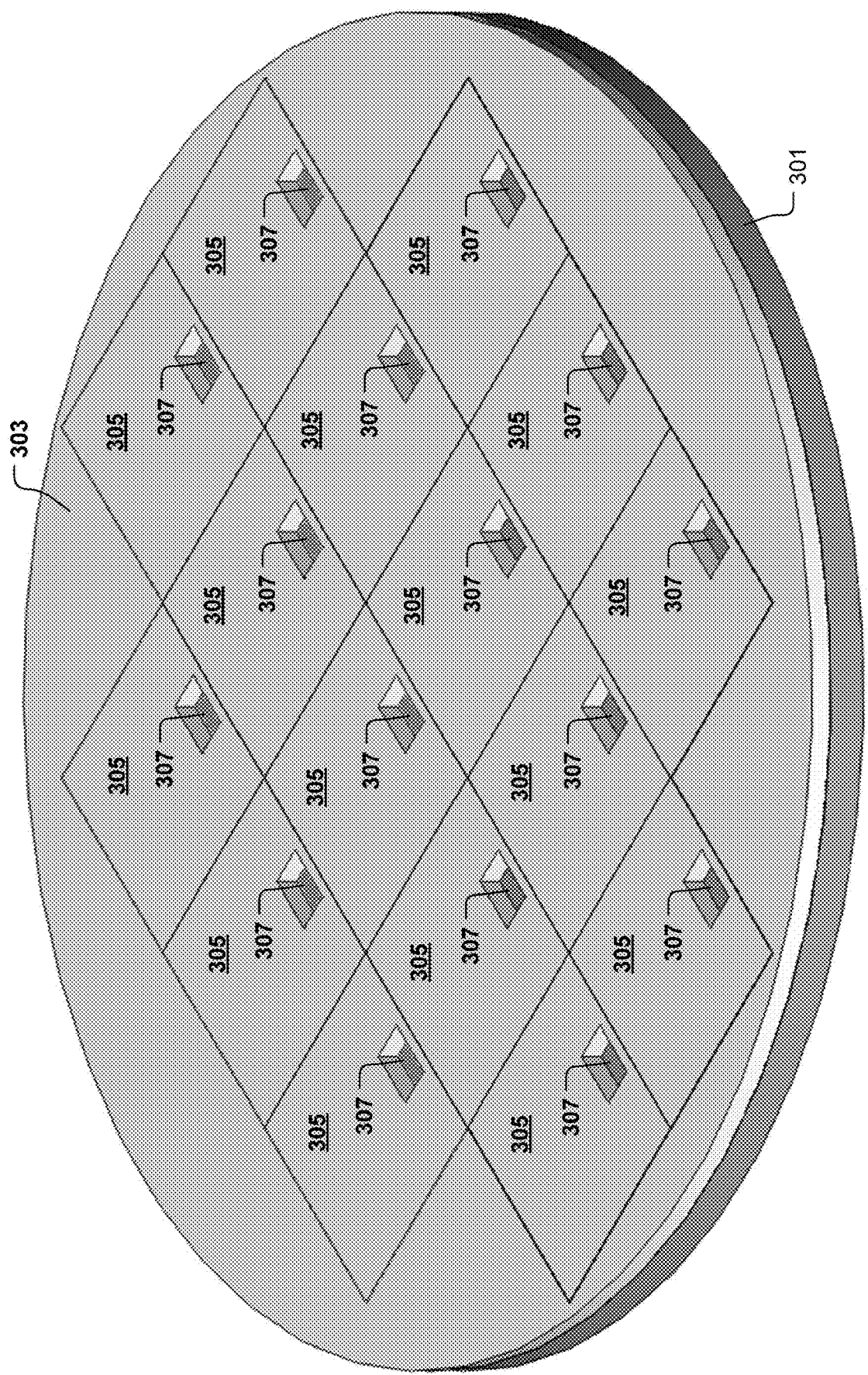
FIG. 3F shows a top isometric view of the RDL structures on the carrier wafer with the cavities (holes) etched through the RDL structures, in accordance with some embodiments.

FIG. 3E shows a top view of the RDL structures 305 on the carrier wafer 301 with cavities 307 (holes) etched through the RDL structures 305, in accordance with some embodiments. FIG. 3F shows a top isometric view of the RDL structures 305 on the carrier wafer 301 with the cavities 307 (holes) etched through the RDL structures 305, in accordance with some embodiments. In some embodiments, the cavities 307 (holes) are etched through an entire thickness of the RDL structures 305 to the top surface of the carrier wafer 301 (or to the top surface of the release layer 307 present on the top surface of the carrier wafer 301). Each cavity 307 is sized and positioned on a given RDL structure 305 so that the cavity 307 will encompass a corresponding set of optical fiber alignment structures 102 of a given die 101 when the given die 101 is flip-chip connected to the given RDL structure 305. In this manner, in some embodiments, with reference to FIG. 2A, a given cavity 307 etched through the RDL structure 305 is sized larger in the x-direction and y-direction than the set of optical fiber alignment structures 102 on the die 101. In some embodiments, with reference to FIG. 2A, a given cavity 307 etched through the RDL structure 305 is sized at least about one millimeter larger in the x-direction and at least about one millimeter larger in the y-direction than the set of optical fiber alignment structures 102 on the die 101. In some embodiments, the cavity 307 is sized larger in the x-direction and larger in the y-direction than the set of optical fiber alignment structures 102 on the die 101 such that an underfill material and/or non-conductive film (NCF) material that is disposed between the die 101 and the RDL structure 305 does not encroach within a specified distance (underfill exclusion distance) of the set of optical fiber alignment structures 102. In various embodiments, the underfill exclusion distance as measured laterally outward from the set of optical fiber alignment structures 102 is set to ensure that the underfill material/NCF material does not enter into the set of optical fiber alignment structures 102 when the die 101 is attached to the RDL structure 305. In some embodiments, the underfill exclusion distance as measured laterally outward from the set of optical fiber alignment structures 102 is within a range extending from about 20 micrometers to about 800 micrometers. In some embodiments, metal structures are excluded from the region of the RDL structure 305 through which the cavity 307 is etched. Therefore, in some embodiments, the RDL structure 305 is configured so that the electrically conductive routing layers 311A within the RDL structure 305 do not pass through the region that is etched to form the cavity 307. In this manner, the cavity 307 is etched through the dielectric material layers 315A within the RDL structure 305, such as through the polyimide material of the RDL structure 305.

Figure 3G:
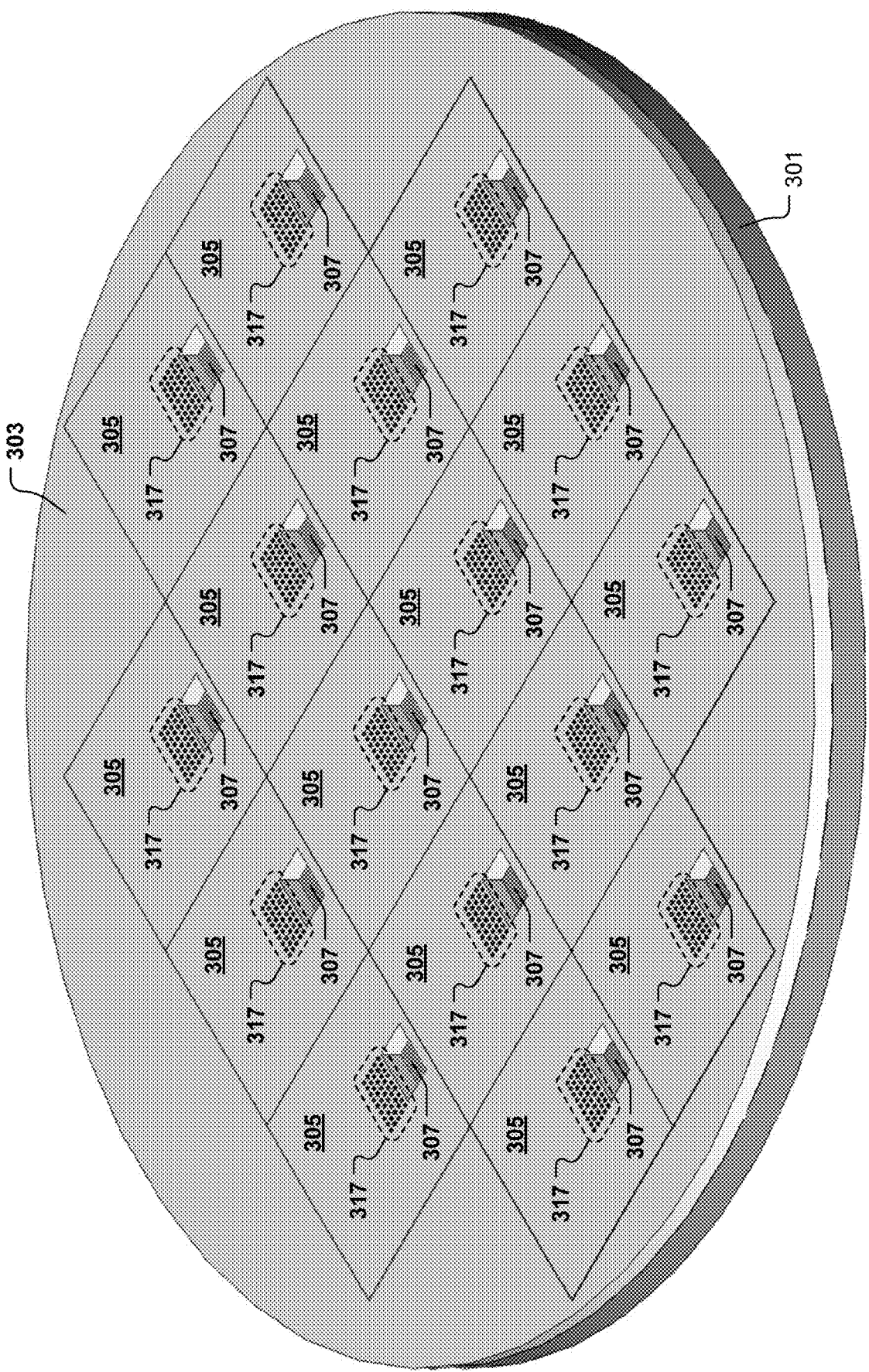
FIG. 3G shows the top isometric view of FIG. 3F with the electrically conductive contact pads exposed on the top surface of each of the RDL structures, in accordance with some embodiments.
Figure 3H:
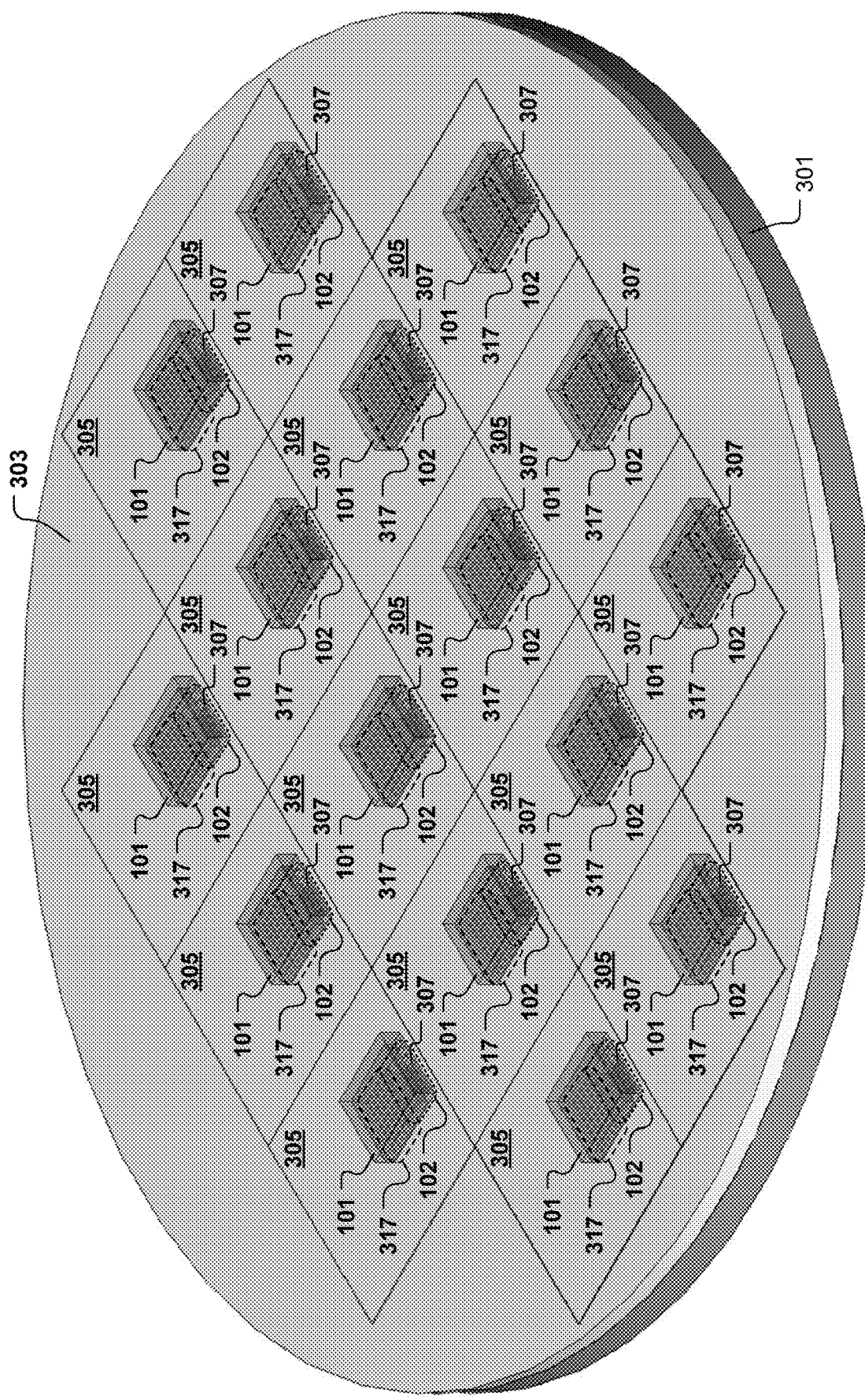
FIG. 3H shows the top isometric view of FIG. 3G with the die flip-chip connected to the RDL structures, in accordance with some embodiments.
Figure 3I:
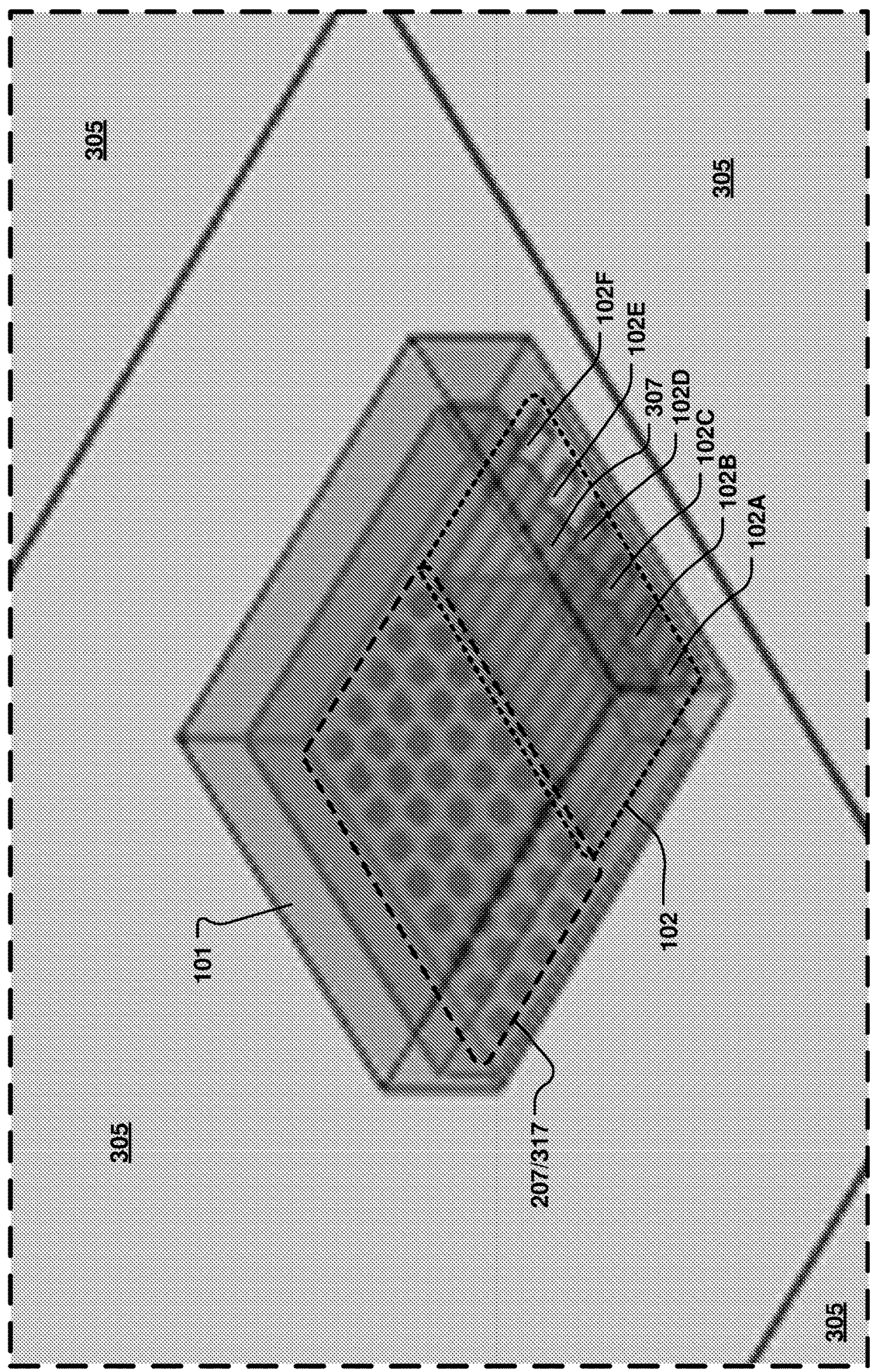
FIG. 3I shows a close-up view of one of the die-to-RDL structure connections of FIG. 3H, in accordance with some embodiments.

FIG. 3G shows the top isometric view of FIG. 3F with the electrically conductive contact pads 317 exposed on the top surface of each of the RDL structures 305, in accordance with some embodiments. Each set of the electrically conductive contact pads 317 is configured to align with electrically conductive contact pads 207 on the die 101 to enable flip-chip connection of the die 101 to the RDL structure 305. FIG. 3H shows the top isometric view of FIG. 3G with the die 101 flip-chip connected to the RDL structures 305, such that the electrically conductive contact pads 207 of the die 101 are electrically connected to corresponding electrically conductive contact pads 317 exposed on the top surface of the RDL structures 305, in accordance with some embodiments. The die 101 are shown in transparent form to facilitate illustration of the positioning of the set of optical fiber alignment structures 102 on the die 101 with respect to the cavities 307 within the RDL structures 305. FIG. 3I shows a close-up view of one of the die 101-to-RDL structure 305 connections of FIG. 3H, in accordance with some embodiments. It should be understood that when the die 101 is flip-chip connected to the RDL structure 305, the set of optical fiber alignments structures 102 on the die 101 are positioned over the cavity 307 within the RDL structure 305, with the backside of the die 101 (base substrate 107 side of the die 101) facing upward away from the RDL structure 305. Also, it should be understood that when the die 101 is flip-chip connected to a given RDL structure 305, the die 101 is oriented so that the optical fiber alignment structures 102A-102F extend lengthwise toward an edge of the cavity 307 that is proximate to an outer edge of the given RDL structure 305. In some embodiments, the die 101 is oriented relative to the given RDL structure 305 so that an outer edge of the die 101 corresponding to the residual kerf region 203 is positioned substantially parallel to the outer edge of the given RDL structure 305 that is proximate to (runs next to) the cavity 307 formed within the given RDL structure 305. In some embodiments, when the die 101 is flip-chip connected to the RDL structure 305, the die 101 is positioned relative to the RDL structure 305 so that an entirety of each optical fiber alignment structure 102A-102F is positioned over the cavity 307. In this manner, the residual kerf region 203 of the die 101 interfaces with the RDL structure 305 to form a barrier that prevents intrusion of material into the optical fiber alignment structures 102A-102F and into the cavity 307 from the top side of the WLFO assembly 303. In some embodiments, a precision of the alignment of the set of optical fiber alignment structures 102 on the die 101 with respect to the cavities 307 within the RDL structures 305 is determined by the application. For example, some applications (some SDP and/or MCP designs) will allow for less precise alignment of the set of optical fiber alignment structures 102 on the die 101 with respect to the cavities 307 within the RDL structures 305, whereas other applications will require that the set of optical fiber alignment structures 102 on the die 101 be aligned more precisely to the cavities 307 within the RDL structures 305. In some embodiments, the die 101 is placed on the RDL structure 305 with a placement accuracy of plus or minus 5 micrometers.

Figure 3J:
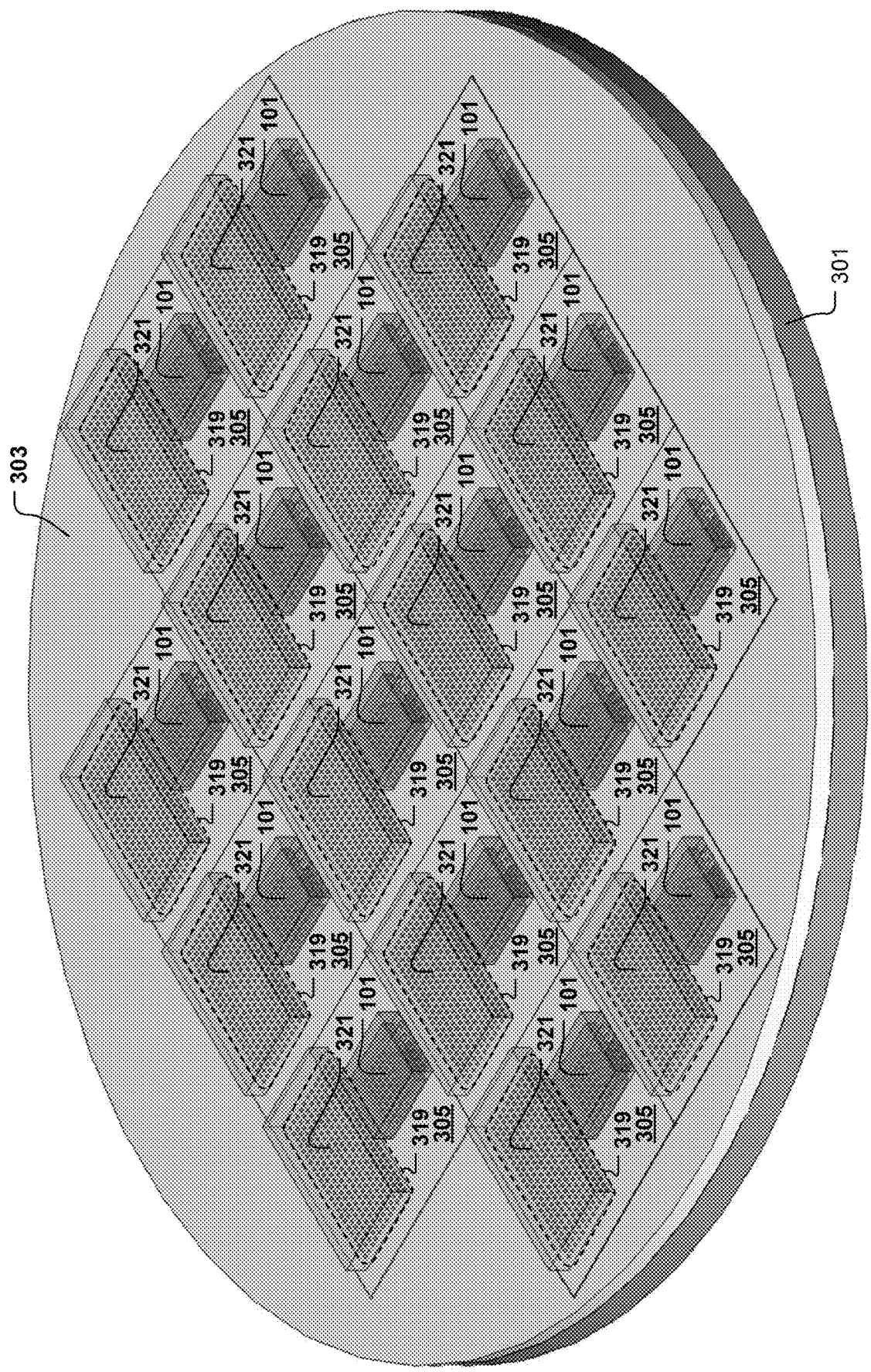
FIG. 3J shows the top isometric view of FIG. 3H with electrically conductive contact pads exposed on the top surface of each of the RDL structures to provide for flip-chip connection of additional die to each of the RDL structures, in accordance with some embodiments.

In some embodiments, multiple die are attached to a given RDL structure 305 to form an MCP. FIG. 3J shows the top isometric view of FIG. 3H with electrically conductive contact pads 319 exposed on the top surface of each of the RDL structures 305 to provide for flip-chip connection of additional die 321 to each of the RDL structures 305, in accordance with some embodiments. The die 321 are shown in transparent form to facilitate illustration of the electrically conductive contact pads 319 exposed on the top surface of the RDL structures 305. In some embodiments, the die 321 are integrated circuit die. However, in various embodiments, each of the die 321 is essentially any type of electronic die, photonic die, electro-optical die, and/or any other photonic-equipped die. In various embodiments, each of the die 321 is either a thin-BOX SOI die, a thick-BOX SOI die, and/or bulk CMOS die, among other types of semiconductor die. It should be understood that in various embodiments, essentially any number and configuration of die (e.g., die 101 and 321, etc.) can be connected to the RDL structures 305 using essentially any chip connection technology available in the semiconductor industry, such as flip-chip connection technology and/or wire bonding connection technology and/or thermosonic bonding connection technology, among others.

Figure 3K:
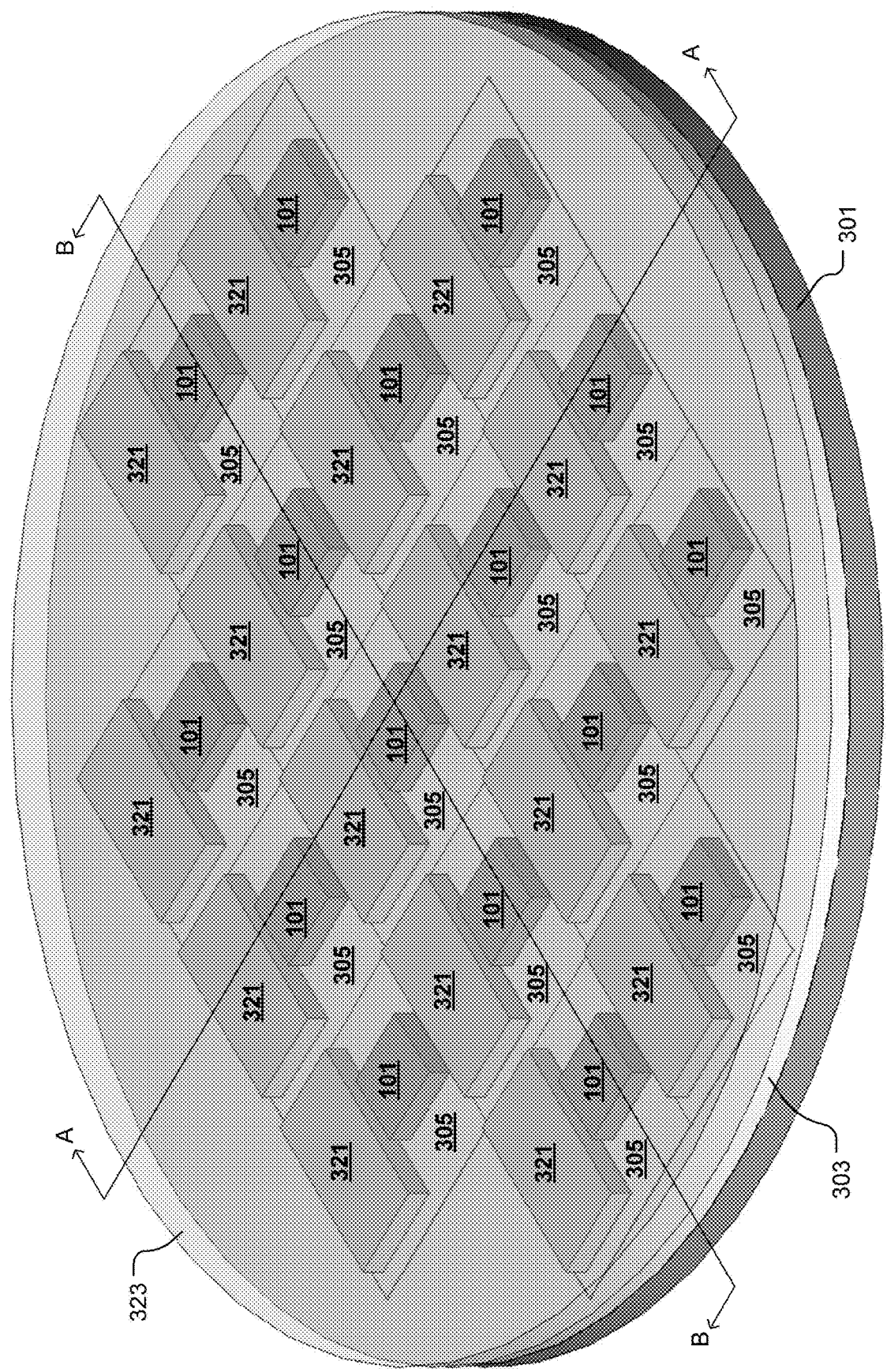
FIG. 3K shows the top isometric view of FIG. 3J with the mold compound material disposed thereover, in accordance with some embodiments.
Figure 3M:
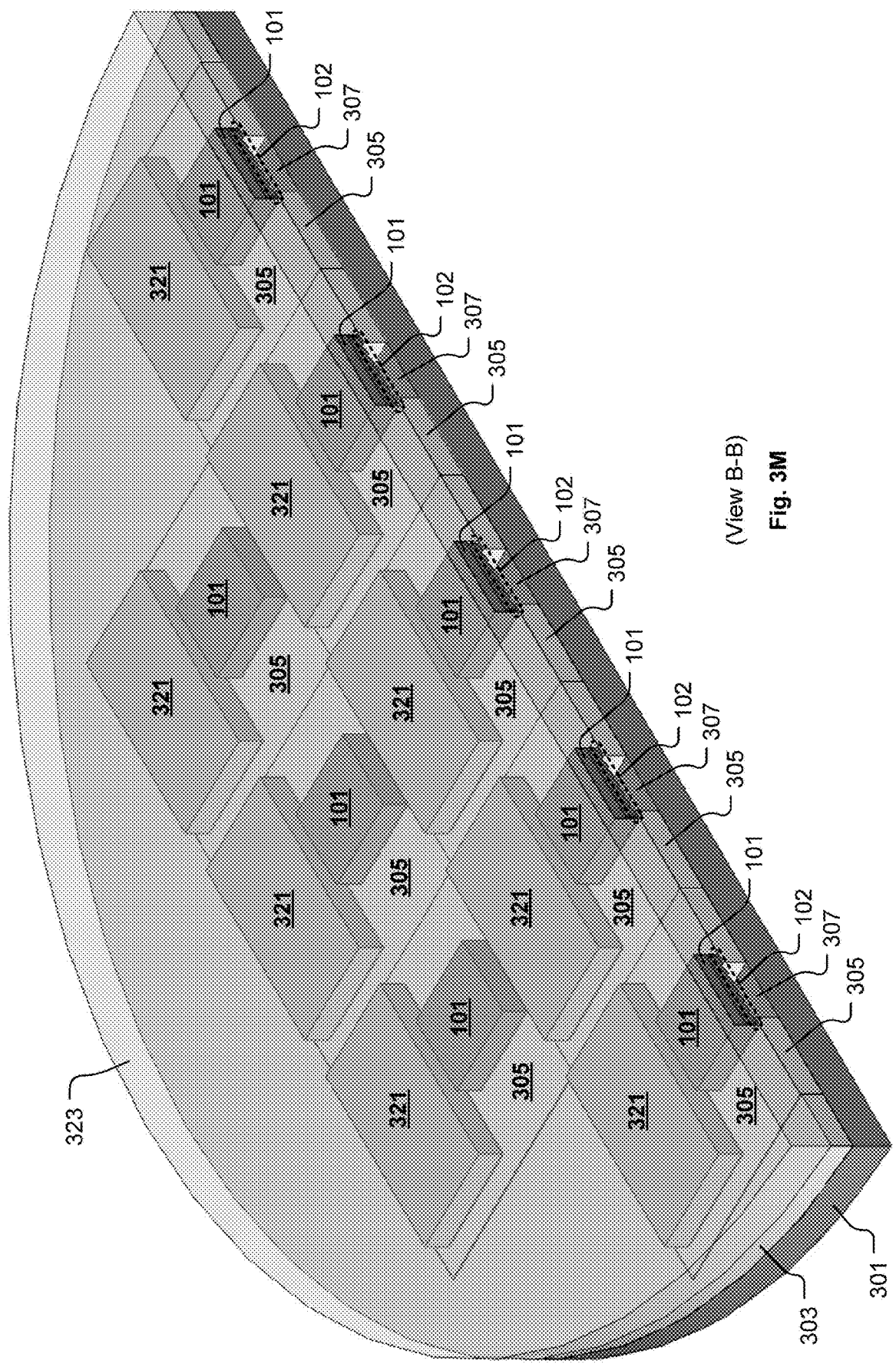
FIG. 3M shows an isometric vertical cross-section view through the configuration of FIG. 3K, corresponding to View B-B, in accordance with some embodiments.

After the die 101 and the additional die 321 (if present) are flip-chip connected to the RDL structures 305, a mold compound material 323 is disposed over the exposed portions of the WLFO assembly 303, the exposed portions of the top surfaces of the RDL structures 305, the die 101, and the additional die 321 (if present). FIG. 3K shows the top isometric view of FIG. 3J with the mold compound material 323 disposed thereover, in accordance with some embodiments. FIG. 3L shows a vertical cross-section view through the configuration of FIG. 3K, corresponding to View A-A identified in FIG. 3K, in accordance with some embodiments. FIG. 3M shows an isometric vertical cross-section view through the configuration of FIG. 3K, corresponding to View B-B identified in FIG. 3K, in accordance with some embodiments. The mold compound material 323 is shown in transparent form to facilitate illustration of the die 101 and additional die 321 that are present within/below the mold compound material 323. In some embodiments, the mold compound material 323 is a polymer material. In some embodiments, the mold compound material 323 is injection molded over the exposed portions of the WLFO assembly 303, the exposed portions of the top surfaces of the RDL structures 305, the die 101, and the additional die 321 (if present). In some embodiments, the mold compound material 323 is disposed as a coating of a liquid polymer material, with the liquid polymer material thereafter being allowed to cure to form a solid polymer material. In some embodiments, the liquid polymer material is a liquid polymer composite material. For example, in some embodiments, the liquid polymer composite material includes an epoxy matrix with fill (particulate) material dispersed within the epoxy matrix. It should be understood that the dam thickness size 208 of the residual kerf region 203, as discussed with regard to FIG. 2A, is sized to prevent fracture of the residual kerf region 203 when external pressure is applied to the die 101 during application of the mold compound material 323 over the die 101, such as during an injection molding process.

In some embodiments, an underfill material, such as a dielectric underfill material, is disposed between the die 101 and the RDL structure 305 to prevent intrusion of the mold compound material between the die 101 and the RDL structure 305. Also, in some embodiments, if the additional die 321 are present, an underfill material, such as a dielectric underfill material, is disposed between the die 321 and the RDL structure 305 to prevent intrusion of the mold compound material 323 between the die 321 and the RDL structure 305. In some embodiments, the dielectric underfill material is a capillary underfill (CUF) material, such as an epoxy and/or an epoxy that has filler material dispersed within the epoxy. In some embodiments, the dielectric underfill material is a non-conductive film (NCF) material. In some embodiment, the dielectric underfill material is a non-conductive paste material. Also, it should be understood that the residual kerf region 203, as shown in FIGS. 2A-2B, interfaces with the top surface of the RDL structure 305 to form a dam feature that prevents intrusion of the mold compound material 323 into the optical fiber alignment structures 102A-102F, and that prevents intrusion of the mold compound material 323 into the cavities 307 that are present within the RDL structures 305 below the die 101.

Figure 3N:
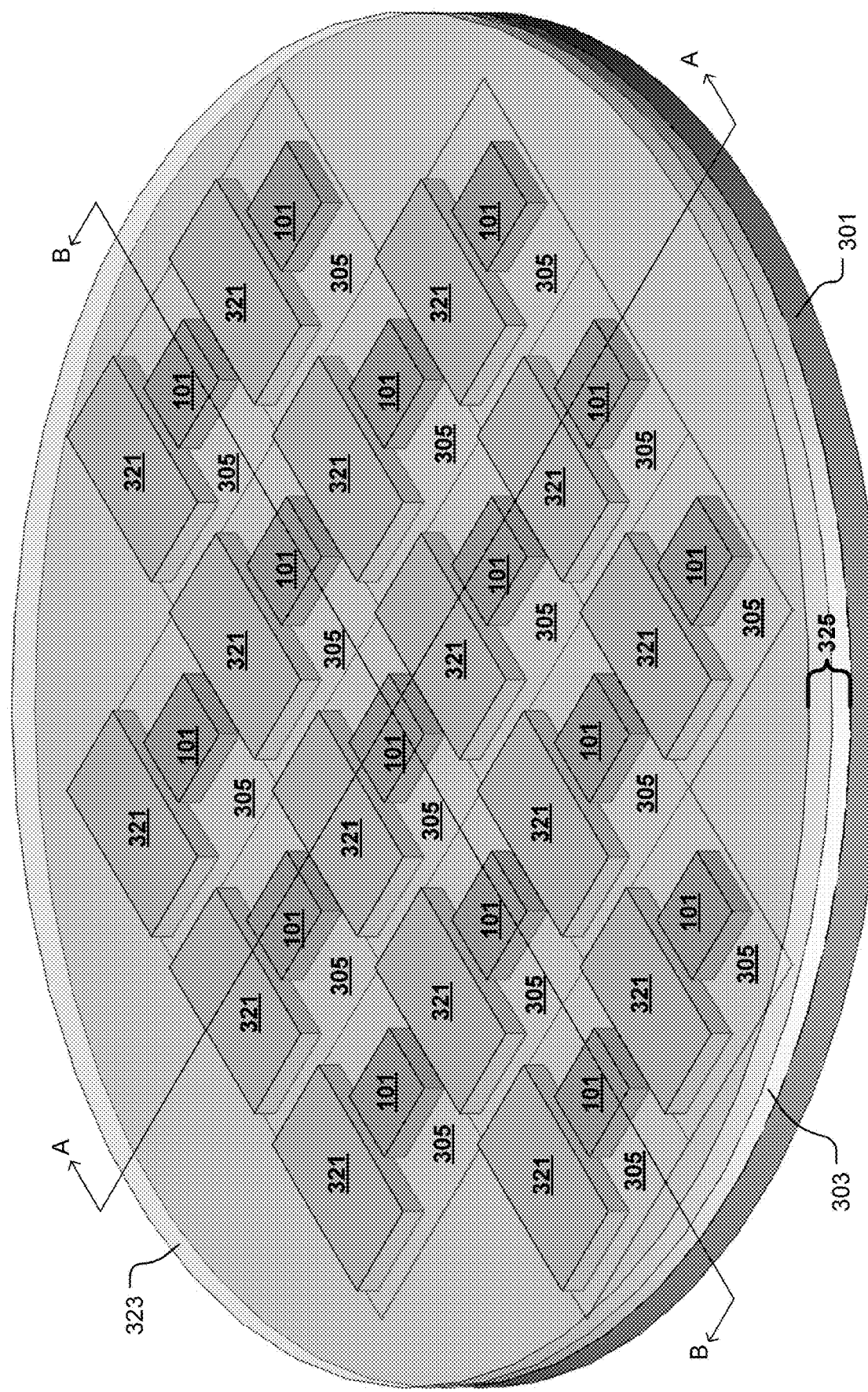
FIG. 3N shows the top isometric view of FIG. 3K with the mold compound material thinned/planarized to reveal the die and the additional die 321 (if present), in accordance with some embodiments.
Figure 3P:
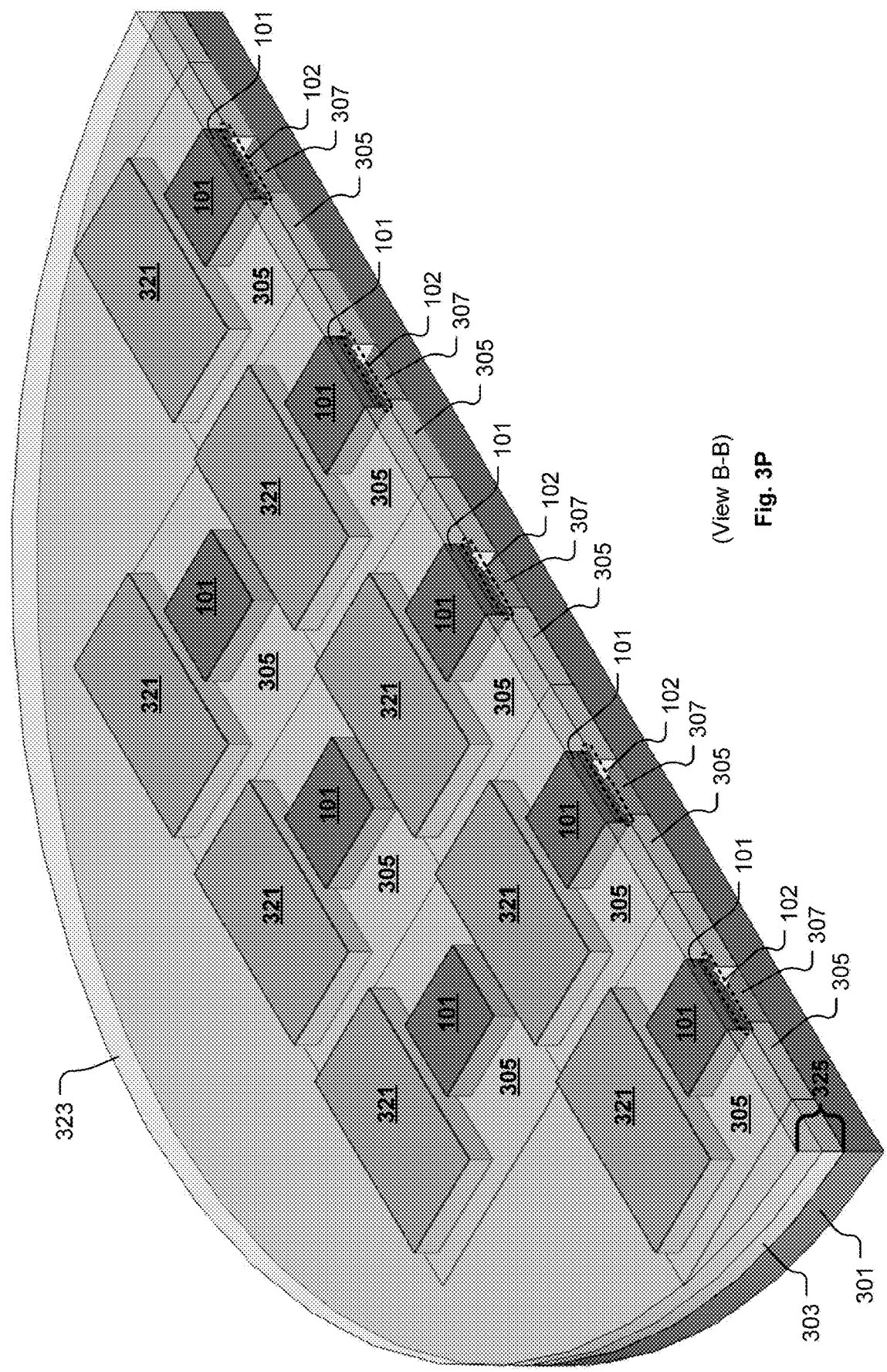
FIG. 3P shows an isometric vertical cross-section view through the configuration of FIG. 3N, corresponding to View B-B, in accordance with some embodiments.

In some embodiments, after the mold compound material 323 is disposed over the exposed portions of the WLFO assembly 303, the exposed portions of the top surfaces of the RDL structures 305, the die 101, and the additional die 321 (if present), the mold compound material 323 is thinned (or planarized) to reveal the top surfaces of the die 101 and the additional die 321 (if present). FIG. 3N shows the top isometric view of FIG. 3K with the mold compound material 323 thinned/planarized to reveal the die 101 and the additional die 321 (if present), in accordance with some embodiments. FIG. 3O shows a vertical cross-section view through the configuration of FIG. 3N, corresponding to View A-A identified in FIG. 3N, in accordance with some embodiments. FIG. 3P shows an isometric vertical cross-section view through the configuration of FIG. 3N, corresponding to View B-B identified in FIG. 3N, in accordance with some embodiments. In various embodiments, the mold compound material 323 is thinned/planarized using one or more of various semiconductor fabrication technologies, such as mechanical grinding, polishing, chemical mechanical planarization (CMP), plasma-based etching, wet etching, and/or dry etching, among other technologies. In some embodiments, the mold compound material 323 is thinned/planarized so that the top surface of the mold compound material 323 is substantially flush (even) with top surfaces of the die 101 and die 321 (if present). In some embodiments, the mold compound material 323 is thinned/planarized to enable connection of one or more thermal management device(s)/structure(s) to the top surfaces of the die 101 and the additional die 321 (if present). In some embodiments, the thermal management device(s)/structure(s) is one or more of a heat sink, a thermoelectric cooler, a heat pipe, or essentially any other type of thermal management device/structure for controlling a temperature of semiconductor die within an SDP and/or MCP.

Figure 3Q:
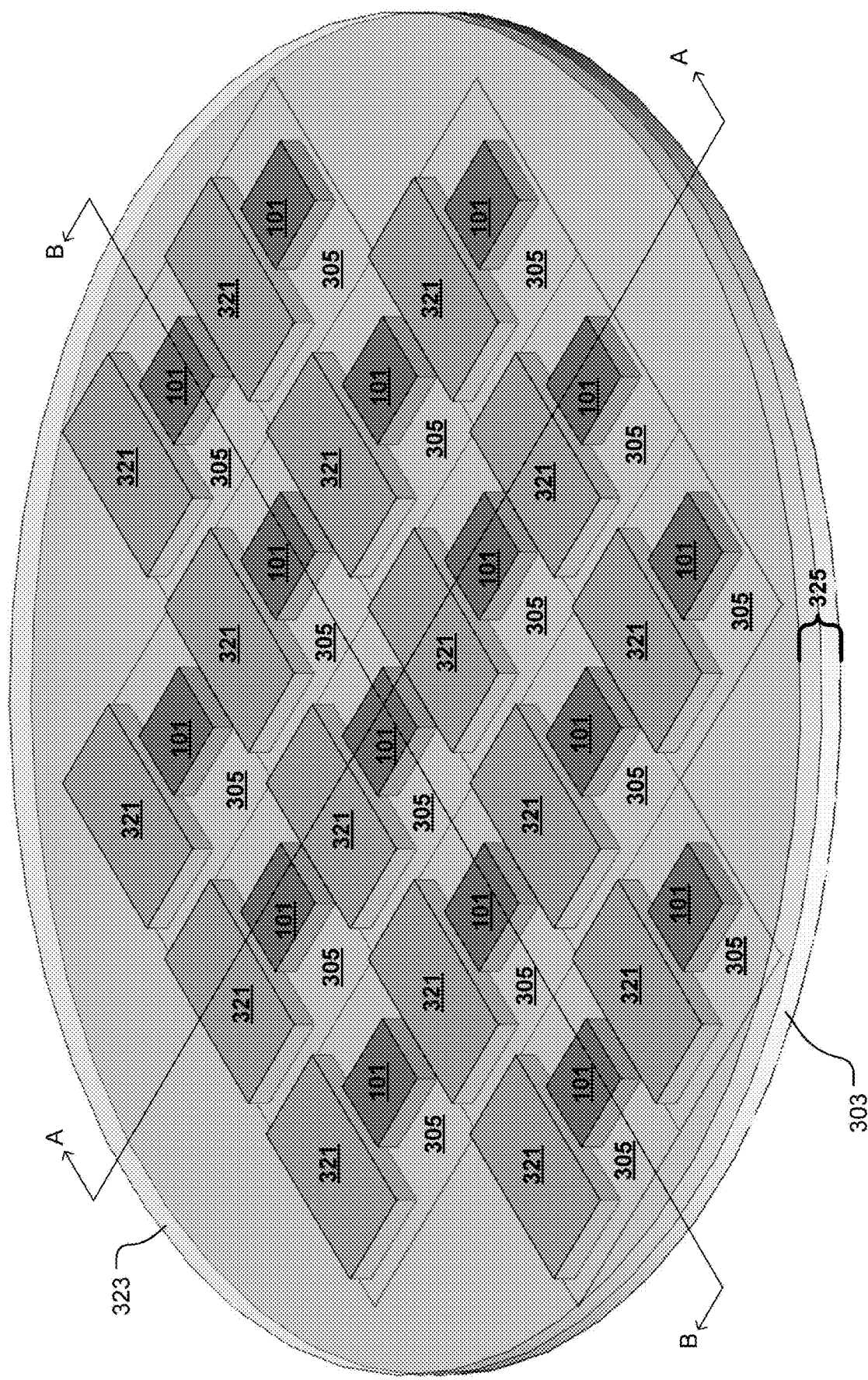
FIG. 3Q shows the top isometric view of FIG. 3N with the carrier wafer removed from the reconstructed wafer, in accordance with some embodiments.
Figure 3S:
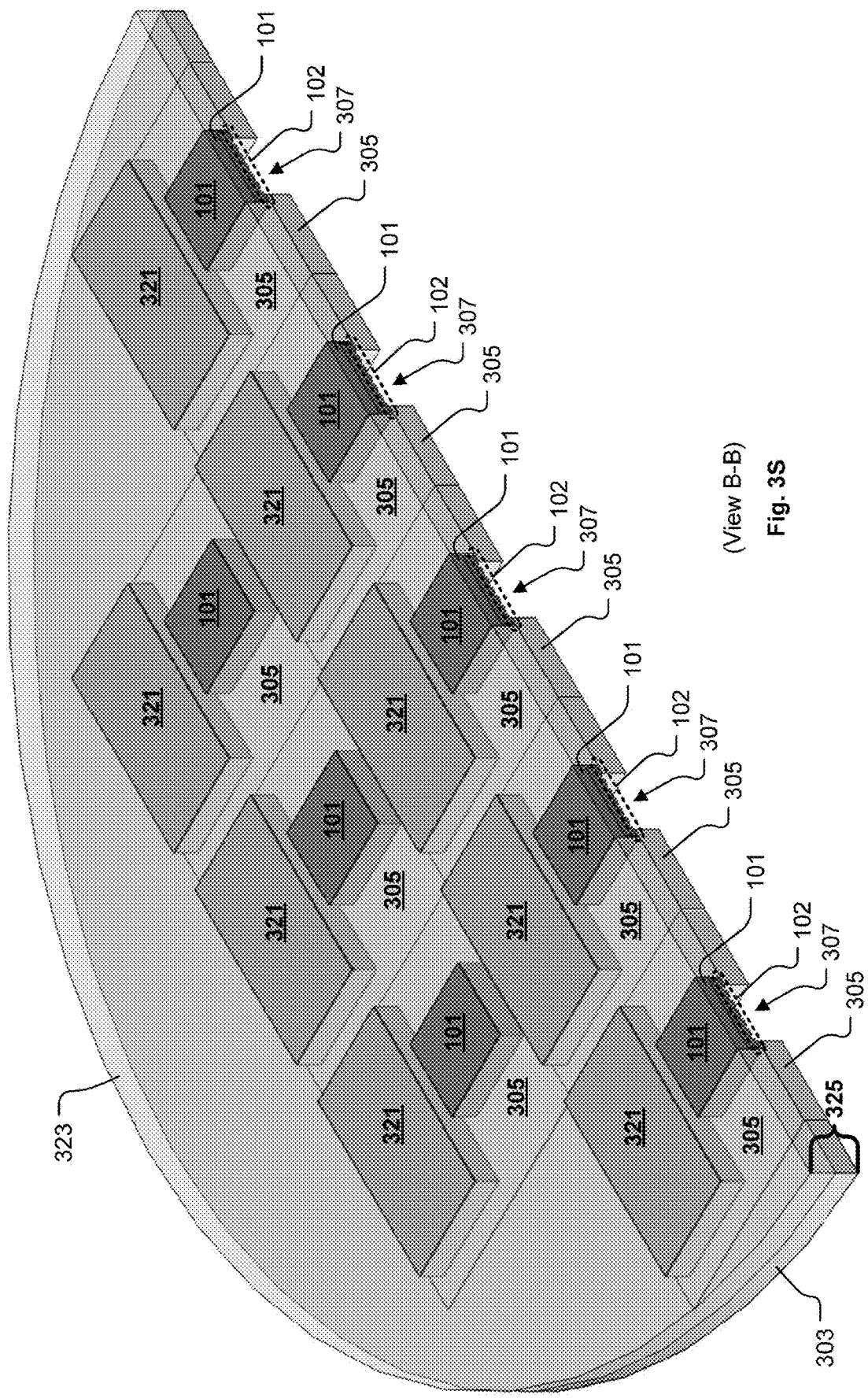
FIG. 3S shows an isometric vertical cross-section view through the configuration of FIG. 3Q, corresponding to View B-B, in accordance with some embodiments.

After the mold compound material 323 is disposed over the exposed portions of the WLFO assembly 303, the exposed portions of the top surfaces of the RDL structures 305, the die 101, and the additional die 321 (if present), and after the mold compound material 323 is optionally thinned/planarized to reveal the top surfaces of the die 101 and the additional die 321 (if present), the combination of the WLFO assembly 303, the RDL structures 305, the die 101, the additional die 321 (if present) and the mold compound material 323 constitutes a reconstructed wafer 325. After the reconstructed wafer 325 is formed, the carrier wafer 301 is removed/released from the reconstructed wafer 325. FIG. 3Q shows the top isometric view of FIG. 3N with the carrier wafer 301 removed from the reconstructed wafer 325, in accordance with some embodiments. FIG. 3R shows a vertical cross-section view through the configuration of FIG. 3Q, corresponding to View A-A identified in FIG. 3Q, in accordance with some embodiments. FIG. 3S shows an isometric vertical cross-section view through the configuration of FIG. 3Q, corresponding to View B-B identified in FIG. 3Q, in accordance with some embodiments. It should be understood that after the carrier wafer 301 is removed/released from the reconstructed wafer 325, the cavities 307 formed within the RDL structures 305 are exposed, so as to also expose the set of optical alignment structures 102 that are positioned over the cavities 307.

Figure 3T:
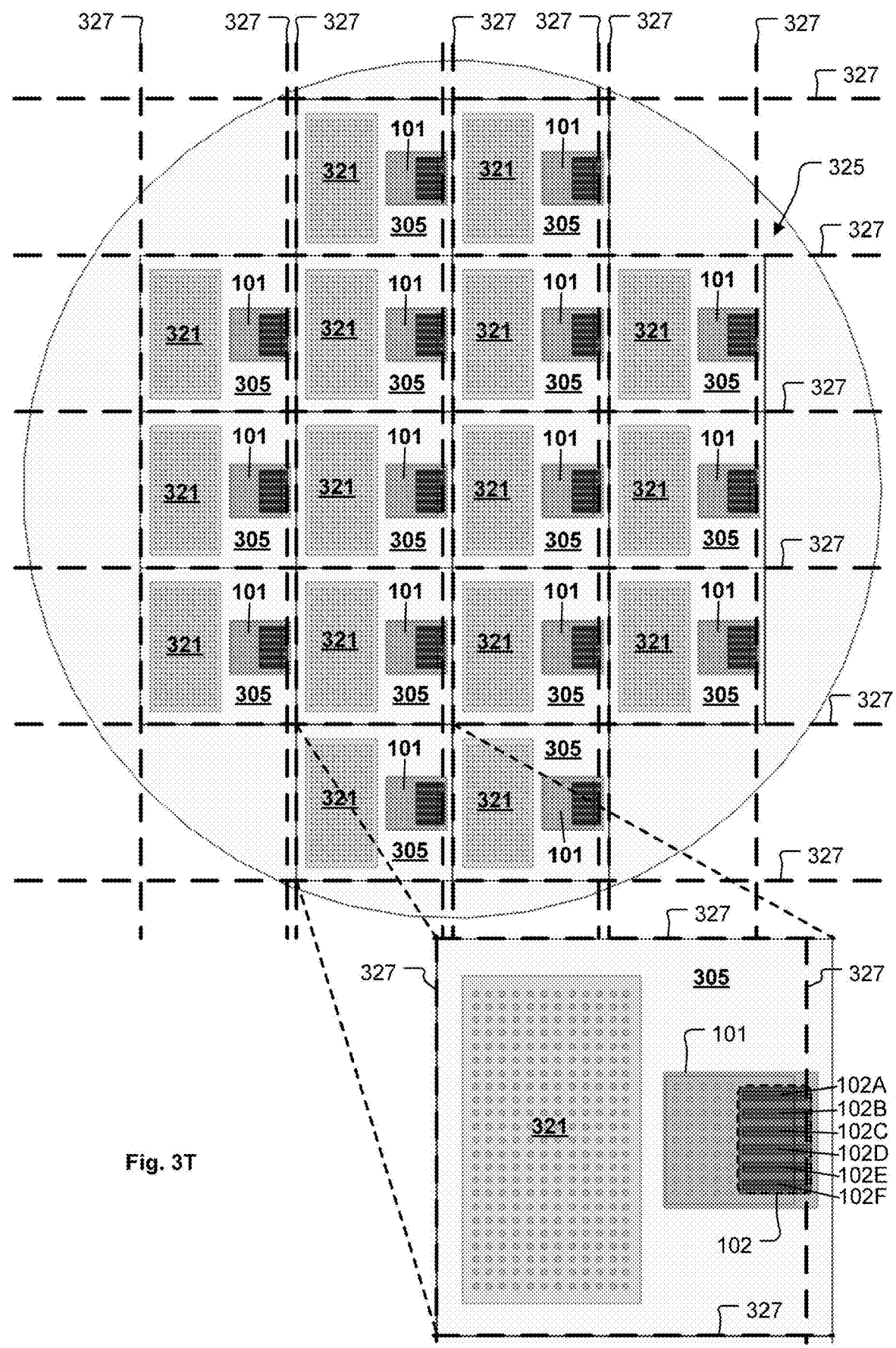
FIG. 3T shows a bottom view of the reconstructed wafer with cutting lines shown where the reconstructed wafer is to be cut to obtain SDP's and/or MCP's corresponding to each of the RDL structures in individual form, in accordance with some embodiments.

After the carrier wafer 301 is removed, the reconstructed wafer 325 is cut to obtain the SDP's and/or MCP's corresponding to each of the RDL structures 305 in individual form. In some embodiments, the reconstructed wafer 325 is placed on a film frame to facilitate cutting/singulation of the reconstructed wafer 325. FIG. 3T shows a bottom view of the reconstructed wafer 325 with cutting lines 327 shown where the reconstructed wafer 325 is to be cut to obtain SDP's and/or MCP's corresponding to each of the RDL structures 305 in individual form, in accordance with some embodiments. The RDL structures 305 are shown in transparent form in FIG. 3T to facilitate illustration of locations of the cutting lines 327 relative to the die 321. The cutting lines 327 are positioned to cross through the set of optical fiber alignment structures 102 on the die 101, such that portions of the residual kerf regions 203 are removed from the die 101 during cutting of the reconstructed wafer 325 so as to reveal the optical fiber alignment structures 102A-102F and cavity 307 at the edge of each individual SDP and/or MCP obtained from the cutting the reconstructed wafer 325.

Figure 4A:
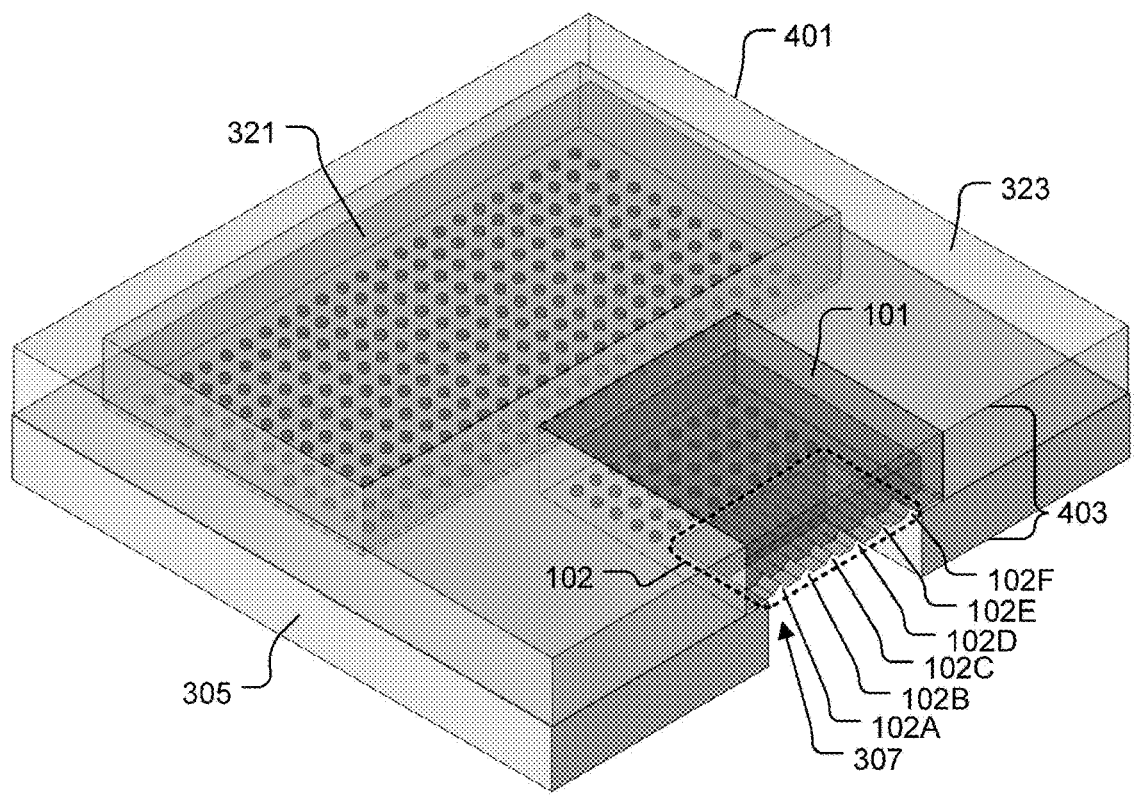
FIG. 4A shows a top isometric view of an MCP obtained from the reconstructed wafer, in accordance with some embodiments.
Figure 4B:
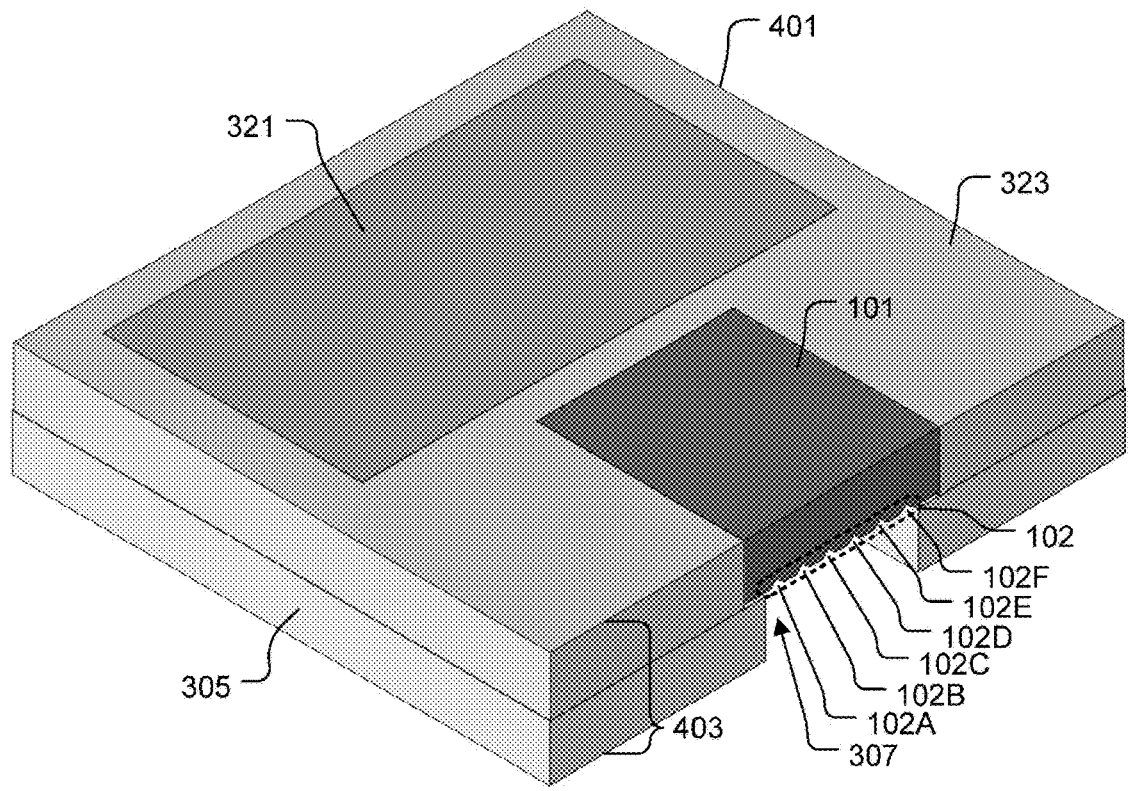
FIG. 4B shows the top isometric view of the MCP of FIG. 4A in non-transparent form, in accordance with some embodiments.
Figure 4C:
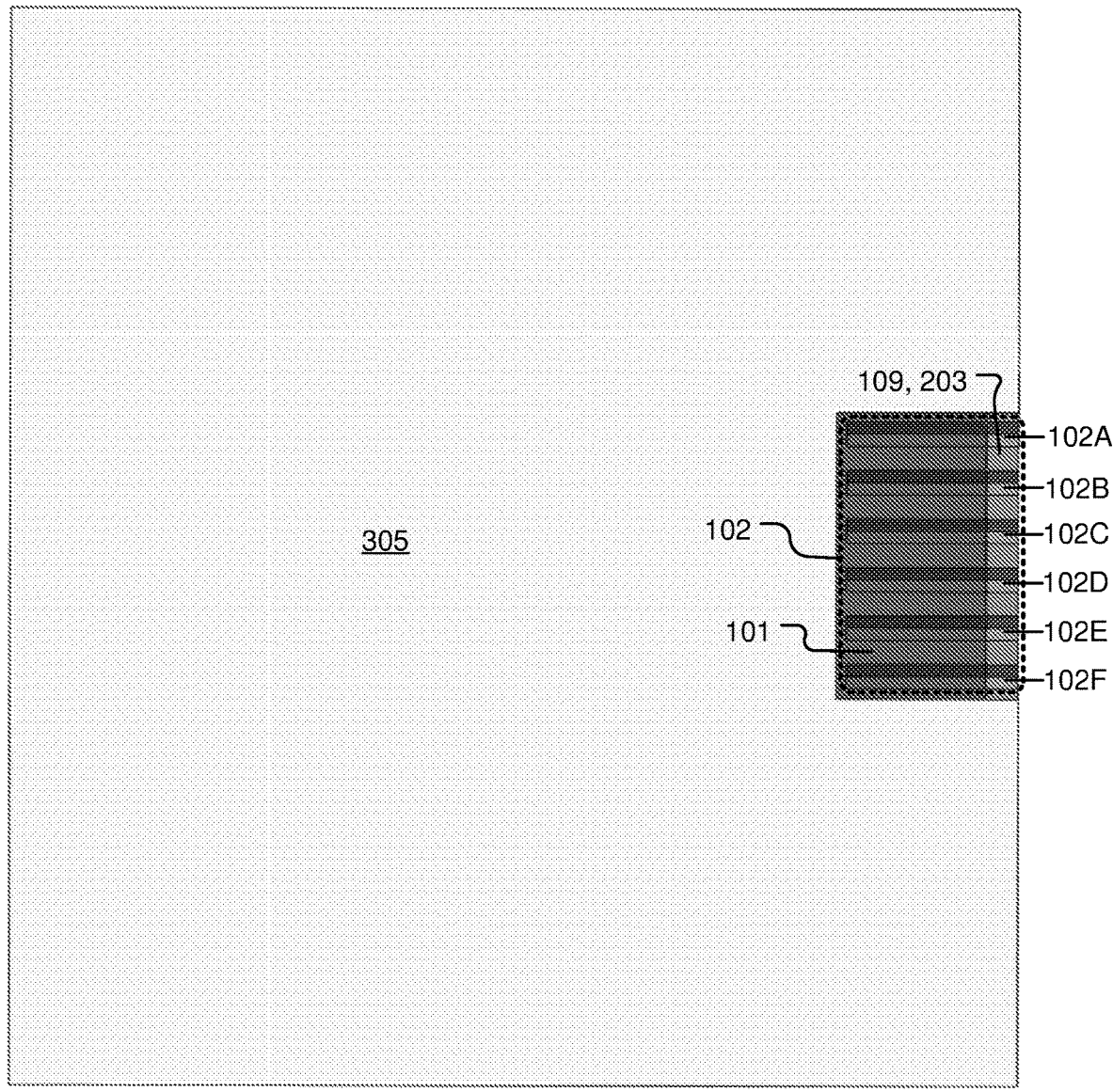
FIG. 4C shows a bottom view of the MCP, in accordance with some embodiments.
Figure 4D:
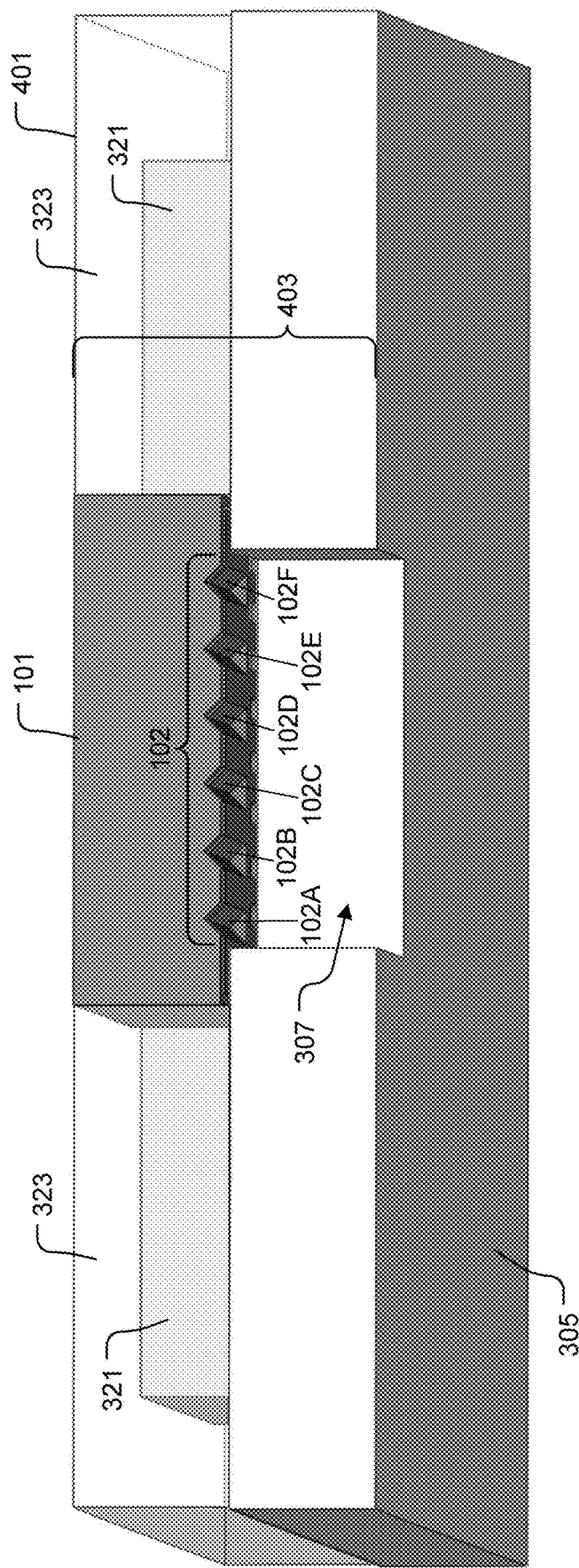
FIG. 4D shows a perspective bottom view of the MCP looking toward the edge of the MCP, in accordance with some embodiments.

FIG. 4A shows a top isometric view of an MCP 401 obtained from the reconstructed wafer 325, in accordance with some embodiments. The MCP 401 includes the RDL structure 305 with both the die 101 and the die 321 flip-chip connected to the RDL structure 305. The MCP 401 also includes the mold compound material 323 formed over the RDL structure 305 and around both the die 101 and the die 321. The mold compound material 323, the die 101, and the die 321 are shown in transparent form in FIG. 4A to illustrate the configuration of the MCP 401 and the exposure of the optical fiber alignment structures 102A-102F and the cavity 307 at the edge 403 of the MCP 401. FIG. 4B shows the top isometric view of the MCP 401 of FIG. 4A in non-transparent form, in accordance with some embodiments. FIG. 4C shows a bottom view of the MCP 401, in accordance with some embodiments. FIG. 4D shows a perspective bottom view of the MCP 401 looking toward the edge 403 of the MCP 401, in accordance with some embodiments.

During cutting of the re-constructed wafer 325 to obtain the MCP 401 in individual form (to release the MCP 401), the contiguous outer portion of the residual kerf region 203 of the die 101 that laterally bounds/encapsulates the ends of the set of optical fiber alignment structures 102 within the die 101 is cut off, so as to leave the optical fiber alignment structures 102A-102F open, clean, and ready for insertion of optical fibers. In this manner, a portion of the residual kerf region 203 is removed when the edge 403 of the MCP 401 is formed so as to expose the optical fiber alignment structures 102A-102F and cavity 307 at the edge 403 of the MCP 401.

Figure 5A:
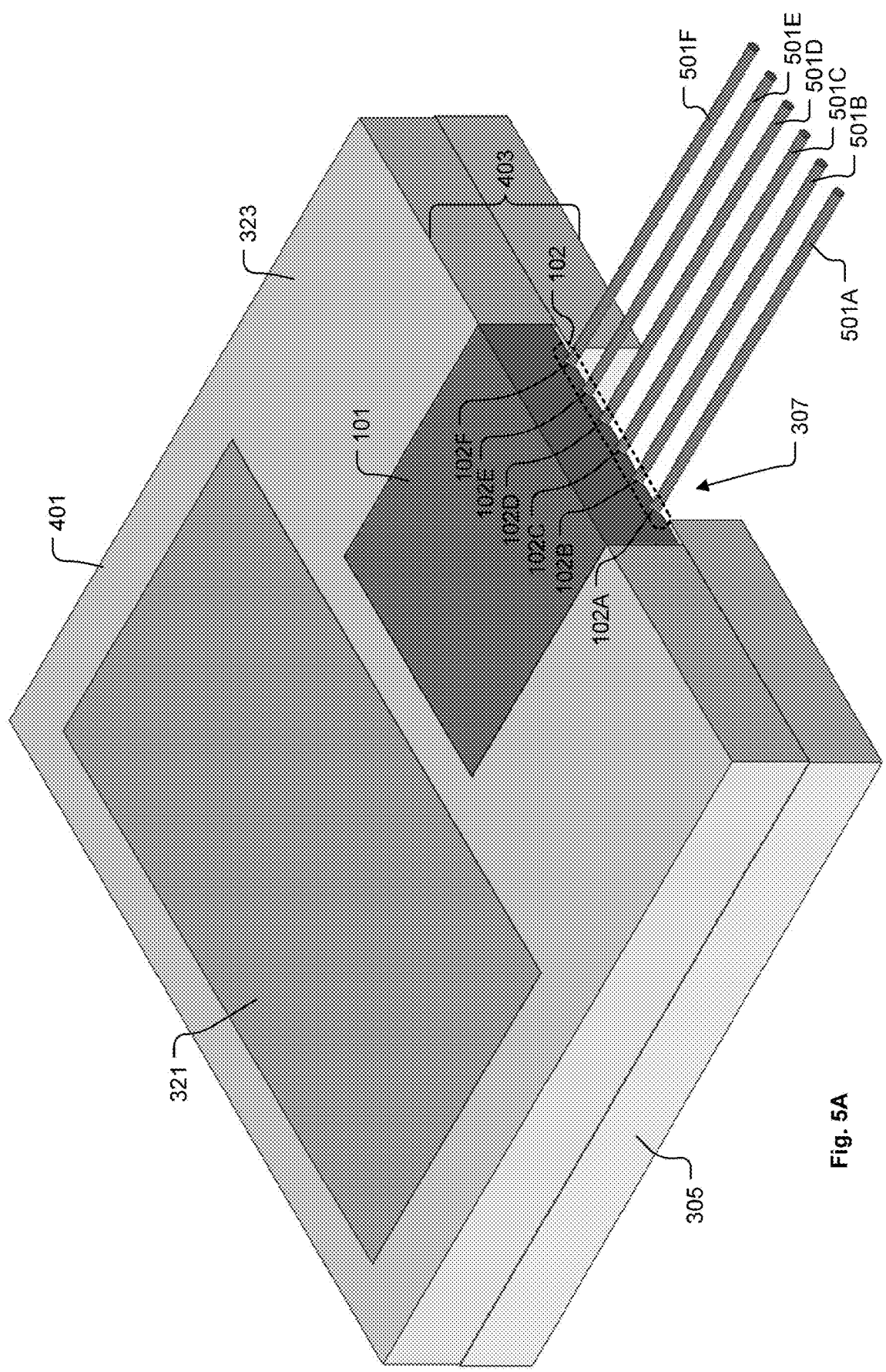
FIG. 5A shows a top isometric view of the MCP with optical fibers respectively positioned within the optical fiber alignment structures within the cavity, in accordance with some embodiments.
Figure 5B:
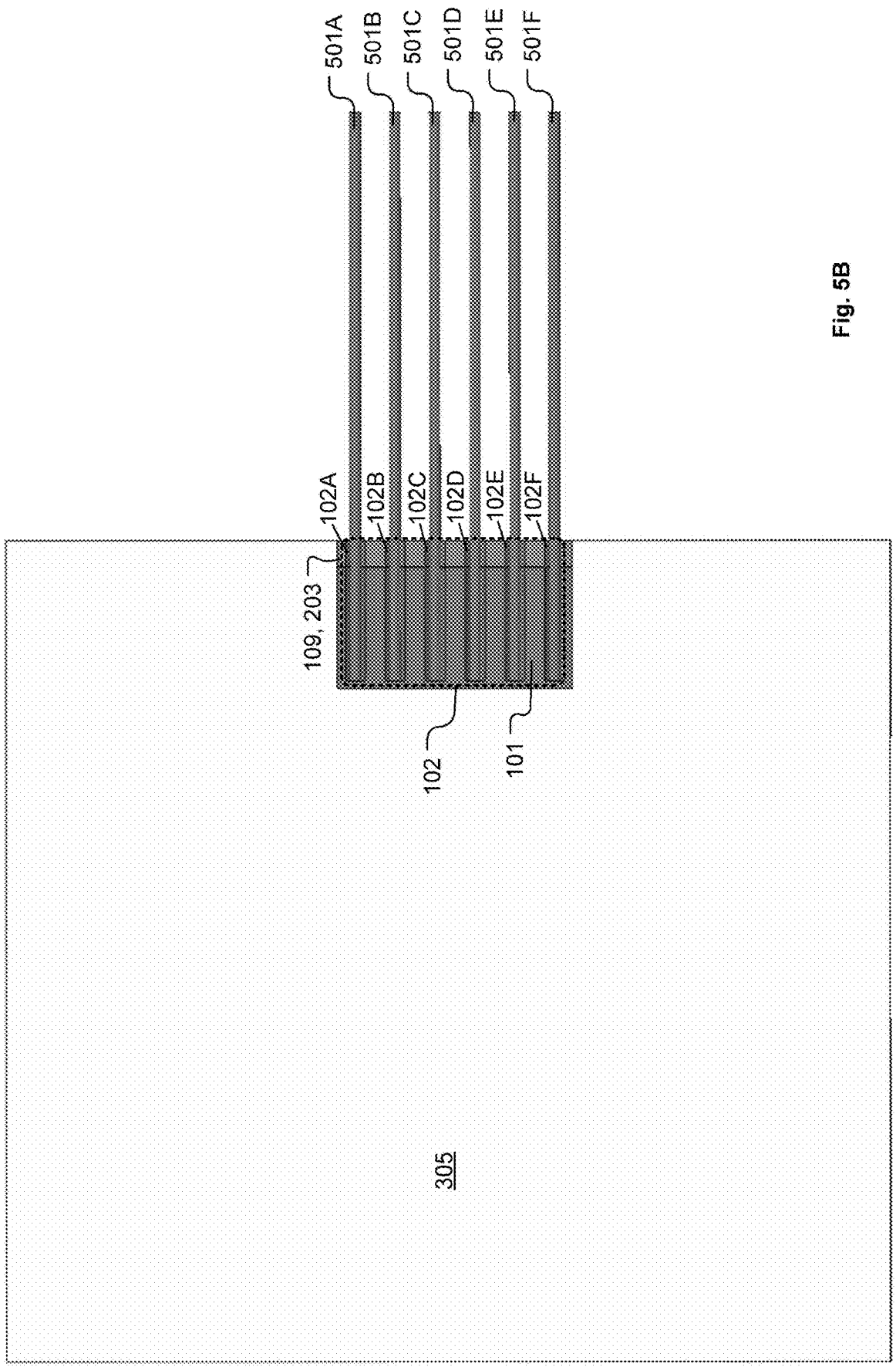
FIG. 5B shows a bottom view of the MCP with the optical fibers attached to the die, in accordance with some embodiments.
Figure 5C:
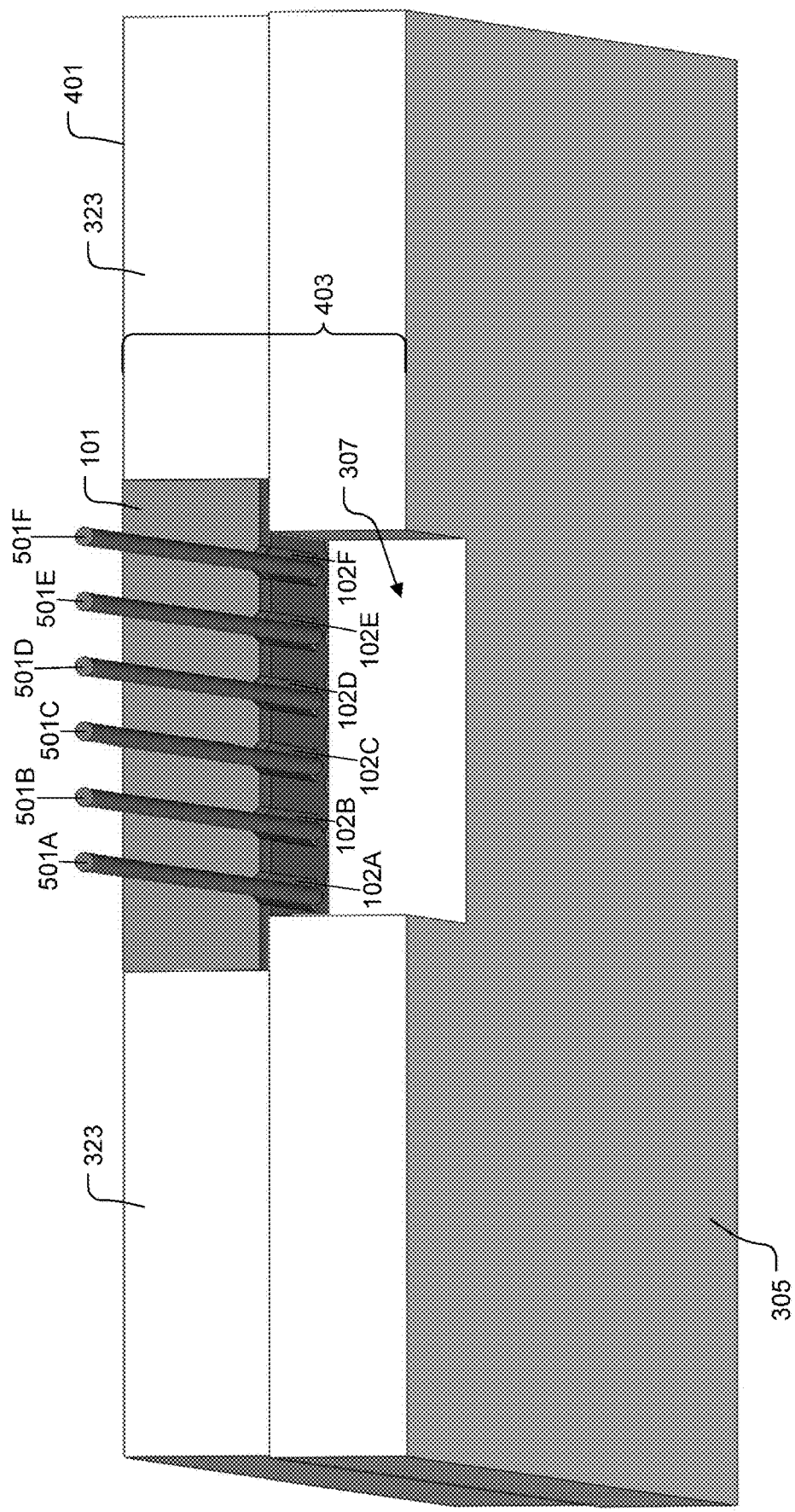
FIG. 5C shows a perspective bottom view of the MCP with the optical fibers attached to the die, in accordance with some embodiments.
Figure 6:
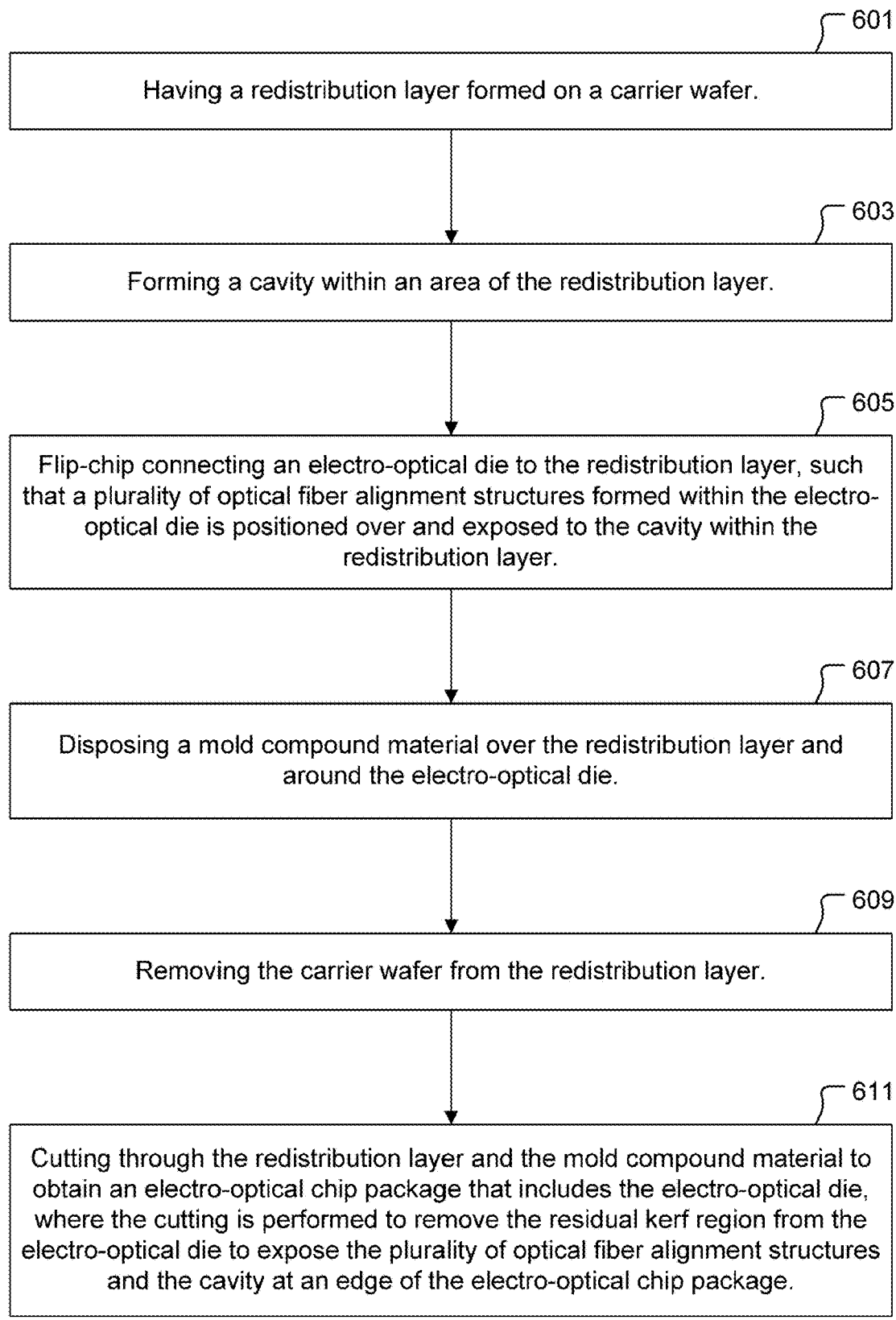

FIG. 5A shows a top isometric view of the MCP 401 with optical fibers 501A-501F respectively positioned within the optical fiber alignment structures 102A-102F within the cavity 307, in accordance with some embodiments. It should be understood that the optical fiber alignments structures 102A-102F and the cavity 307 are configured to enable attachment of the optical fibers 501A-501F to the die 101 within the MCP 401, such that cores of the optical fibers 501A-501F are optically coupled to corresponding optical waveguides 209A-209F (see FIG. 2C) within the die 101. FIG. 5B shows a bottom view of the MCP 401 with the optical fibers 501A-501F attached to the die 101, in accordance with some embodiments. FIG. 5C shows a perspective bottom view of the MCP 401 with the optical fibers 501A-501F attached to the die 101, in accordance with some embodiments. In some embodiments, an adhesive (such as an optical epoxy, among others) is used to secure to the optical fibers 501A-501F to the die 101 and to the MCP 401. In some embodiments, a cover structure is disposed within the cavity 307 over the optical fibers 501A-501F to assist with securing of the optical fibers 501A-501F to the die 101 and to protect the optical fibers 501A-501F.

FIG. 6 shows a flowchart of a method for packaging an electro-optical die, in accordance with some embodiments. The method includes an operation 601 for having a redistribution layer, e.g., RDL structure 305, formed on a carrier wafer, e.g., carrier wafer 301. In some embodiments, the redistribution layer includes one or more electrically conductive routing layers separated from each other by intervening dielectric material layers. In some embodiments, the one or more electrically conductive routing layers of the redistribution layer include electrically conductive traces that distribute electrical connections of input/output pads of the electro-optical die to respective locations within an area larger than the electro-optical die. The method also includes an operation 603 for forming a cavity, e.g., cavity 307, within an area of the redistribution layer. In some embodiments, the cavity is formed to extend through a full thickness of the redistribution layer.

The method also includes an operation 605 for flip-chip connecting an electro-optical die, e.g., die 101, to the redistribution layer, such that a plurality of optical fiber alignment structures, e.g., optical fiber alignment structures 102A-102F, formed within the electro-optical die is positioned over and exposed to the cavity within the redistribution layer. In some embodiments, the cavity formed within the redistribution layer is shaped and sized to laterally encompass at least three adjacent sides of the plurality of optical fiber alignment structures formed within the electro-optical die when the electro-optical die is flip-chip connected to the redistribution layer.

The method also includes an operation 607 for disposing a mold compound material, e.g., mold compound material 323, over the redistribution layer and around the electro-optical die. In some embodiments, the mold compound material is disposed to cover a top surface of the electro-optical die. In some embodiments, the method includes removal of a partial thickness of the mold compound material to expose the top surface of the electro-optical die. In some embodiments, an underfill material is disposed between the electro-optical die and the redistribution layer before disposing the mold compound material over the redistribution layer and around the electro-optical die. A residual kerf region of the electro-optical die, e.g., residual kerf region 203, interfaces with the redistribution layer to prevent the mold compound material from entering into the plurality of optical fiber alignment structures and the cavity. In some embodiments, the plurality of optical fiber alignment structures on the electro-optical die is formed to extend into the residual kerf region. In some embodiment, the residual kerf region laterally bounds the plurality of optical fiber alignment structures on the electro-optical die.

In some embodiments, the plurality of optical fiber alignment structures includes multiple v-grooves positioned in a side-by-side arrangement and oriented to extend parallel to each other in a first direction, e.g., x-direction, that is perpendicular to the edge of the electro-optical die. In some embodiments, the multiple v-grooves are positioned in accordance with a substantially equal center-to-center spacing, e.g., spacing 211, as measured in a second direction, e.g., y-direction, perpendicular to the first direction between each adjacent pair of the multiple v-grooves. In some embodiments, a size of the cavity as measured in the second direction is greater than a total size of the multiple v-grooves as measured in the second direction. In some embodiments, a size of the cavity as measured in the first direction is greater than a size of the multiple v-grooves as measured in the first direction. In some embodiments, a size of the cavity as measured in the first direction is less than a size of the multiple v-grooves as measured in the first direction.

The method also includes an operation 609 for removing the carrier wafer from the redistribution layer. In some embodiments, removing the carrier wafer from the redistribution layer exposes the cavity formed within the redistribution layer. The method also includes an operation 611 for cutting through the redistribution layer and the mold compound material to obtain an electro-optical chip package, e.g., MCP 401, that includes the electro-optical die. The cutting is performed to remove the residual kerf region from the electro-optical die to expose the plurality of optical fiber alignment structures and the cavity at an edge of the electro-optical chip package.

In some embodiments, the method further includes flip-chip connecting an integrated circuit die, e.g., die 321, to the redistribution layer before disposing the mold compound material. In some embodiments, the mold compound material is also disposed around the integrated circuit die. In some embodiments, cutting through the redistribution layer and the mold compound material is done so that the electro-optical chip package includes both the electro-optical die and the integrated circuit die.

In some embodiments, the method further includes having the electro-optical die manufactured on an intact semiconductor wafer, e.g., wafer 100, with the electro-optical die surrounded by kerf regions, e.g., kerf regions 106, of the intact semiconductor wafer. The method also includes forming the plurality of optical fiber alignment structures within the electro-optical die at the edge of the electro-optical die so that the plurality of optical fiber alignment structures extend into a portion of a kerf region adjacent to the edge of the electro-optical die. The method also includes singulating the intact semiconductor wafer to obtain the electro-optical die in a singulated form with the portion of the kerf region forming the residual kerf region of the electro-optical die. In some embodiments, the residual kerf region includes a continuous portion of kerf region that laterally encapsulates ends of the plurality of optical fiber alignment structures present within the residual kerf region. In these embodiments, the electro-optical die in the singulated form is flip-chip connected to the redistribution layer.

In some embodiments, an electro-optical chip package, such as the MCP 401, includes a redistribution layer, such as the RDL structure 305. An electro-optical die, such as die 101, is flip-chip connected to the redistribution layer. In some embodiments, an underfill material is disposed between the electro-optical die and the redistribution layer. A portion of the electro-optical die extends laterally over an opening, such as the cavity 307, in the redistribution layer. The opening in the redistribution layer is formed along a portion of an outer lateral edge of the electro-optical chip package. In some embodiments, the opening in the redistribution layer extends through a full thickness of the redistribution layer. The portion of the electro-optical die that extends laterally over the opening in the redistribution layer includes a plurality of optical fiber alignment structures, such as the optical fiber alignment structures 102A-102F. The opening in the redistribution layer is shaped and sized to laterally encompass at least three adjacent sides of the plurality of optical fiber alignment structures formed within the electro-optical die. The plurality of optical fiber alignment structures extend to an edge of the electro-optical die that corresponds to the portion of the outer lateral edge of the electro-optical chip package. A mold compound material, such as the mold compound material 323, is disposed on the redistribution layer and partially around the electro-optical die. The mold compound material is not disposed within the plurality of optical fiber alignment structures. The mold compound material is also not disposed within the opening in the redistribution layer. In some embodiments, the mold compound material is planarized to expose a top surface of the electro-optical die. In some embodiments, the electro-optical chip package also includes an integrated circuit die, such as die 321, that is flip-chip connected to the redistribution layer. In these embodiments, the mold compound material is also disposed around the integrated circuit die.

In some embodiments, the plurality of optical fiber alignment structures is formed as a plurality of v-grooves positioned in a side-by-side arrangement and oriented to extend parallel to each other in a first direction that is perpendicular to the edge of the electro-optical die that corresponds to the portion of the outer lateral edge of the electro-optical chip package. In some embodiments, the plurality of v-grooves is arranged in accordance with a substantially equal center-to-center spacing as measured in a second direction perpendicular to the first direction between each adjacent pair of the plurality of v-grooves. In some embodiments, a size of the opening in the redistribution layer as measured in the second direction is greater than a total size of the plurality of v-grooves as measured in the second direction.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing disclosure includes some detail for purposes of clarity of understanding, it will be apparent that certain changes and modifications can be practiced within the scope of the appended claims. For example, it should be understood that one or more features from any embodiment disclosed herein may be combined with one or more features of any other embodiment disclosed herein. Accordingly, the present embodiments are to be considered as illustrative and not restrictive, and what is claimed is not to be limited to the details given herein, but may be modified within the scope and equivalents of the described embodiments.

What is claimed is:

1. An electro-optical chip package, comprising:
   a redistribution layer;
   an electro-optical die flip-chip connected to the redistribution layer, a portion of the electro-optical die extending laterally over an opening in the redistribution layer, the opening in the redistribution layer formed along a portion of an outer lateral edge of the electro-optical chip package, the portion of the electro-optical die including a plurality of optical fiber alignment structures that extend to an edge of the electro-optical die that corresponds to the portion of the outer lateral edge of the electro-optical chip package, wherein the plurality of optical fiber alignment structures is formed as either a plurality of v-grooves or a plurality of channels positioned in a side-by-side arrangement and oriented to extend parallel to each other in a first direction that is perpendicular to the edge of the electro-optical die that corresponds to the portion of the outer lateral edge of the electro-optical chip package; and
   a mold compound material disposed on the redistribution layer and partially around the electro-optical die, wherein the mold compound material is not disposed within the plurality of optical fiber alignment structures, and wherein the mold compound material is not disposed within the opening in the redistribution layer.

2. The electro-optical chip package as recited in claim 1, wherein the redistribution layer includes one or more electrically conductive routing layers separated from each other by intervening dielectric material layers, wherein the one or more electrically conductive routing layers include electrically conductive traces that distribute electrical connections of input/output pads of the electro-optical die to respective locations within an area larger than the electro-optical die.

3. The electro-optical chip package as recited in claim 1, wherein the opening in the redistribution layer extends through a full thickness of the redistribution layer.

4. The electro-optical chip package as recited in claim 1, wherein the plurality of v-grooves is arranged in accordance with a substantially equal center-to-center spacing as measured in a second direction perpendicular to the first direction between each adjacent pair of the plurality of v-grooves, or wherein the plurality of channels is arranged in accordance with a substantially equal center-to-center spacing as measured in a second direction perpendicular to the first direction between each adjacent pair of the plurality of channels.

5. The electro-optical chip package as recited in claim 4, wherein a size of the opening in the redistribution layer as measured in the second direction is greater than a total size of the plurality of v-grooves or the plurality of channels as measured in the second direction.

6. The electro-optical chip package as recited in claim 1, further comprising:
a plurality of optical fibers respectively disposed within the plurality of v-grooves or the plurality of channels.

7. The electro-optical chip package as recited in claim 6, wherein cores of the plurality of optical fibers are optically coupled to corresponding optical waveguides within the electro-optical die.

8. The electro-optical chip package as recited in claim 6, further comprising:
a cover plate disposed over the plurality of optical fibers and within the opening in the redistribution layer.

9. The electro-optical chip package as recited in claim 8, further comprising:
an adhesive disposed between the cover plate and the electro-optical die within the opening in the redistribution layer.

10. The electro-optical chip package as recited in claim 1, further comprising:
an underfill material disposed between the electro-optical die and the redistribution layer.

11. The electro-optical chip package as recited in claim 1, further comprising:
an integrated circuit die flip-chip connected to the redistribution layer, wherein the mold compound material is also disposed around the integrated circuit die.

12. The electro-optical chip package as recited in claim 11, wherein the mold compound material is planarized to expose both a top surface of the electro-optical die and a top surface of the integrated circuit die.

13. The electro-optical chip package as recited in claim 12, wherein the top surface of the electro-optical die is substantially coplanar with the top surface of the integrated circuit die.

14. The electro-optical chip package as recited in claim 12, further comprising:
at least one thermal management device attached to one or more of the top surface of the electro-optical die and the top surface of the integrated circuit die.

15. The electro-optical chip package as recited in claim 14, wherein the at least one thermal management device is one or more of a heat sink, a thermoelectric cooler, and a heat pipe.

16. The electro-optical chip package as recited in claim 1, wherein the mold compound material is one or more of a polymer material and a polymer composite material.

17. The electro-optical chip package as recited in claim 1, wherein both the outer lateral edge of the electro-optical chip package along which the opening in the redistribution layer is formed and the edge of the electro-optical die that corresponds to the outer lateral edge of the electro-optical chip package correspond to a same cutting line on a reconstructed wafer from which the electro-optical chip package is singulated.

18. An electro-optical chip package, comprising:
a redistribution layer;
an electro-optical die flip-chip connected to the redistribution layer, a portion of the electro-optical die extending laterally over an opening in the redistribution layer, the opening in the redistribution layer formed along a portion of an outer lateral edge of the electro-optical chip package, the portion of the electro-optical die including a plurality of optical fiber alignment structures that extend to an edge of the electro-optical die that corresponds to the portion of the outer lateral edge of the electro-optical chip package, wherein the opening in the redistribution layer is shaped and sized to laterally encompass at least three adjacent sides of the plurality of optical fiber alignment structures formed within the electro-optical die; and
a mold compound material disposed on the redistribution layer and partially around the electro-optical die, wherein the mold compound material is not disposed within the plurality of optical fiber alignment structures, and wherein the mold compound material is not disposed within the opening in the redistribution layer.

19. The electro-optical chip package as recited in claim 18, wherein each of the plurality of optical fiber alignment structures is formed to receive, position, and align a corresponding optical fiber.

20. The electro-optical chip package as recited in claim 18, further comprising:
a plurality of optical fibers respectively disposed within the plurality of optical fiber alignment structures, wherein cores of the plurality of optical fibers are optically coupled to corresponding optical waveguides within the electro-optical die.

21. The electro-optical chip package as recited in claim 20, further comprising:
a cover plate disposed over the plurality of optical fibers and within the opening in the redistribution layer.

22. The electro-optical chip package as recited in claim 21, further comprising:
an adhesive disposed between the cover plate and the electro-optical die within the opening in the redistribution layer.

23. The electro-optical chip package as recited in claim 18, further comprising:
an underfill material disposed between the electro-optical die and the redistribution layer.

24. The electro-optical chip package as recited in claim 18, further comprising:
an integrated circuit die flip-chip connected to the redistribution layer, wherein the mold compound material is also disposed around the integrated circuit die.

25. The electro-optical chip package as recited in claim 24, further comprising:
at least one thermal management device attached to one or more of a top surface of the electro-optical die and a top surface of the integrated circuit die.

26. An electro-optical chip package, comprising:
a redistribution layer;
an electro-optical die flip-chip connected to the redistribution layer, a portion of the electro-optical die extending laterally over an opening in the redistribution layer, the opening in the redistribution layer formed along a portion of an outer lateral edge of the electro-optical chip package, the portion of the electro-optical die including a plurality of optical fiber alignment structures that extend to an edge of the electro-optical die that corresponds to the portion of the outer lateral edge of the electro-optical chip package; and
a mold compound material disposed on the redistribution layer and partially around the electro-optical die, wherein the mold compound material is not disposed within the plurality of optical fiber alignment structures, and wherein the mold compound material is not disposed within the opening in the redistribution layer, wherein the mold compound material is planarized to expose a top surface of the electro-optical die.

27. The electro-optical chip package as recited in claim 26, further comprising:
a plurality of optical fibers respectively disposed within the plurality of optical fiber alignment structures, wherein cores of the plurality of optical fibers are optically coupled to corresponding optical waveguides within the electro-optical die.

28. The electro-optical chip package as recited in claim 27, further comprising:
    a cover plate disposed over the plurality of optical fibers and within the opening in the redistribution layer; and
    an adhesive disposed between the cover plate and the electro-optical die within the opening in the redistribution layer.

29. The electro-optical chip package as recited in claim 26, further comprising:
    an integrated circuit die flip-chip connected to the redistribution layer, wherein the mold compound material is also disposed around the integrated circuit die.

30. The electro-optical chip package as recited in claim 29, further comprising:
    at least one thermal management device attached to one or more of the top surface of the electro-optical die and a top surface of the integrated circuit die.

* * * * *